United States Patent
Tamura

(10) Patent No.: US 9,064,742 B2
(45) Date of Patent: Jun. 23, 2015

(54) SEMICONDUCTOR DEVICE AND MANUFACTURING METHOD THEREOF

(75) Inventor: Jun Tamura, Otsu (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 14/007,760

(22) PCT Filed: Feb. 24, 2012

(86) PCT No.: PCT/JP2012/001285
§ 371 (c)(1),
(2), (4) Date: Sep. 26, 2013

(87) PCT Pub. No.: WO2012/132219
PCT Pub. Date: Oct. 4, 2012

(65) Prior Publication Data
US 2014/0015050 A1   Jan. 16, 2014

(30) Foreign Application Priority Data

Mar. 29, 2011   (JP) .................. 2011-072699

(51) Int. Cl.
*H01L 21/8238* (2006.01)
*H01L 27/12* (2006.01)
*H01L 21/762* (2006.01)
*H01L 21/84* (2006.01)

(52) U.S. Cl.
CPC ........ *H01L 27/1203* (2013.01); *H01L 27/1207* (2013.01); *H01L 21/76283* (2013.01); *H01L 21/84* (2013.01)

(58) Field of Classification Search
None
See application file for complete search history.

(56) References Cited

U.S. PATENT DOCUMENTS

| | | | |
|---|---|---|---|
| 6,221,732 B1 | 4/2001 | Kaneko | |
| 7,129,142 B2* | 10/2006 | Wristers et al. | 438/305 |
| 2003/0203544 A1* | 10/2003 | Chi | 438/149 |
| 2004/0067614 A1* | 4/2004 | Hidaka et al. | 438/200 |
| 2005/0012175 A1 | 1/2005 | Tsuruta | |
| 2005/0045992 A1* | 3/2005 | Turley | 257/552 |
| 2007/0176235 A1 | 8/2007 | Tsujiuchi et al. | |

(Continued)

FOREIGN PATENT DOCUMENTS

| | | | |
|---|---|---|---|
| JP | 7-153837 A | 6/1995 | |
| JP | 8-102498 A | 4/1996 | |

(Continued)

OTHER PUBLICATIONS

International Search Report dated May 22, 2012.

*Primary Examiner* — Evan Pert
*Assistant Examiner* — Herve Assouman
(74) *Attorney, Agent, or Firm* — McGinn IP Law Group, PLLC

(57) ABSTRACT

In a semiconductor device, a logic MOSFET and a switch MOSFET are formed in a high-resistance substrate. The logic MOSFET includes an epitaxial layer formed on the high-resistance substrate and a well layer formed on the epitaxial layer. The switch MOSFET includes a LOCOS oxide film formed on the high-resistance substrate, the LOCOS oxide film being sandwiched between trenches and thus having a mesa-shape in its upper part. The switch MOSFET further includes a buried oxide film and a SOI layer formed on the mesa-shape of the LOCOS oxide film. The upper surface of the mesa-shape of the LOCOS oxide film is positioned at the same height as the upper surface of the epitaxial layer.

20 Claims, 21 Drawing Sheets

(56) References Cited

U.S. PATENT DOCUMENTS

2008/0191271 A1    8/2008    Yagishita et al.
2008/0224253 A1    9/2008    Sagae et al.

FOREIGN PATENT DOCUMENTS

| | | |
|---|---|---|
| JP | 2001-7196 A | 1/2001 |
| JP | 2001-7219 A | 1/2001 |
| JP | 2004-214596 A | 7/2004 |
| JP | 2007-201240 A | 8/2007 |
| JP | 2008-172082 A | 7/2008 |
| JP | 2008-227084 A | 9/2008 |

* cited by examiner

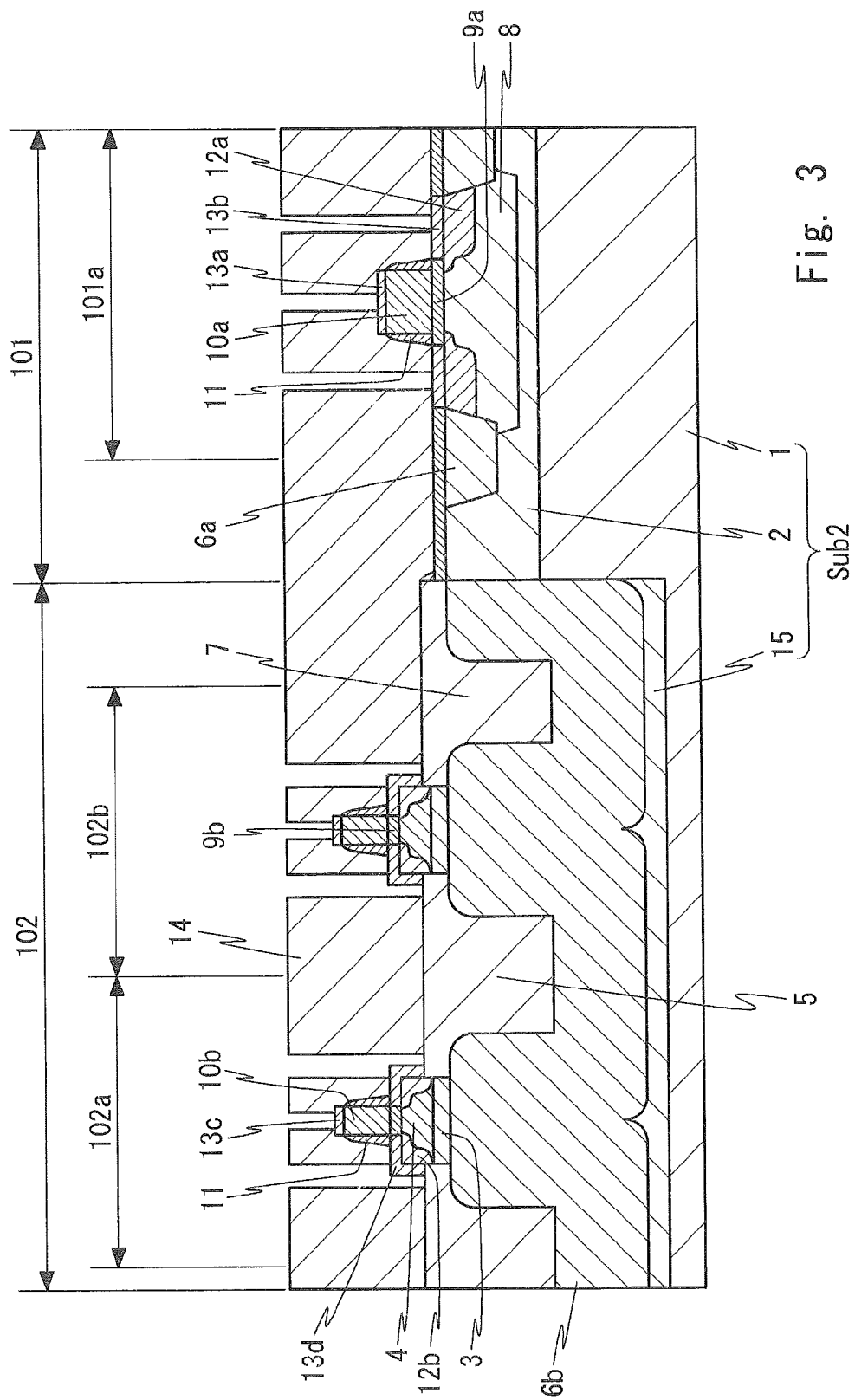

SEMICONDUCTOR DEVICE AND MANUFACTURING METHOD THEREOF

TECHNICAL FIELD

The present invention relates to a semiconductor device and its manufacturing method, in particular to a semiconductor device in which a plurality of types of elements are provided in a mixed manner and its manufacturing method.

BACKGROUND ART

As transmission/reception select switches in portable electronic devices such as mobile phones, compound semiconductor elements have been used in the past. However, the improvement in the high-frequency characteristics of silicon MOSFETs (Metal-Oxide-Semiconductor Field-Effect Transistors) that has been achieved by forming silicon MOSFETs on SOI (Silicon on Insulator) substrates or SOS (Silicon on Sapphire) substrates is remarkable in recent years. As a result, opportunities for silicon MOSFETs to be applied as high-frequency switches of portable electronic devices are increasing.

A transmission loss, a harmonic distortion, and an intermodulation distortion (IMD) are some examples of the important characteristics that indicate the performance of a high-frequency switch. These characteristics can be improved by reducing the CR product that is the product of the parasitic capacitance C and the on-resistance R of the MOSFET.

Therefore, it has been attempted to reduce the parasitic capacitance C and the on-resistance R by reducing the element size of a MOSFET and thereby reducing the channel length. As a method for reducing a parasitic capacitance C, reduction in the capacitance of source/drain diffusion layers and the miniaturization of a gate length achieved by adopting a thin-film SOI substrate have been known. A thin-film SOI substrate used for such purposes is manufactured, for example, by a smart-cut method.

A typical semiconductor device in which MOSFETs are formed on an SOI substrate (Patent literature 1) is explained. FIG. 5 is a cross section showing a structure of a typical semiconductor device 300 in which MOSFETs are formed on an SOI substrate. In the semiconductor device 300, the SOI substrate includes a p-type silicon substrate 314. The silicon substrate 314 includes a first region 310 and a second region 312. A high voltage transistor 313 is formed in the first region 310. Other examples of the semiconductor element that can be formed in the first region 310 include a vertical bipolar transistor. A MOS field-effect transistor 315 having an SOI structure is formed in the second region 312. Examples of the circuit that can be formed in the second region 312 include a circuit for which a high-speed operation or low power consumption is necessary (for example, a circuit used in a portable information device or the like).

Next, details of the first region 310 are explained. The high voltage transistor 313 includes a gate electrode 340, source/drain 334a and 336a, and source/drain offsets 334b and 336b. A p-type well 316 is formed in the silicon substrate 314 in the first region 310. A gate oxide film 338 is formed on the well 316. The thickness of the gate oxide film 338 is, for example, 40 to 100 nm. Offset LOCOS oxide films 322 and 324 are formed above the well 316 so as to sandwich the gate oxide film 338 therebetween. The gate electrode 340 is formed on the gate oxide film 338. One end of the gate electrode 340 is located on the offset LOCOS oxide film 322. The other end of the gate electrode 340 is located on the offset LOCOS oxide film 324.

An n-type source/drain offset 334b is formed in the well 316 beneath the offset LOCOS oxide film 322. An n-type source/drain 334a is formed in the well 316. The n-type source/drain 334a is located beside the source/drain offset 334b. An n-type source/drain offset 336b is formed in the well 316 beneath the offset LOCOS oxide film 324. An n-type source/drain 336a is formed in the well 316. The n-type source/drain 336a is located beside the source/drain offset 336b.

An element separation LOCOS oxide film 326 is formed at one end of the well 316, and an element separation LOCOS oxide film 320 is formed at the other end of the well 316. A p-type channel stopper region 330 is formed in the well 316 beneath the element separation LOCOS oxide film 326. A p-type channel stopper region 332 is formed in the well 316 beneath the element separation LOCOS oxide film 320. An inter-layer insulating film 350 is formed above the silicon substrate 314 so as to cover the gate electrode 340. A through hole 342 for exposing the source/drain 334a is formed in the inter-layer insulating film 350. An aluminum line 346 is formed on the inter-layer insulating film 350. The aluminum line 346 is also formed inside the through hole 342 and electrically connected to the source/drain 334a. A through hole 344 for exposing the source/drain 336a is formed in the inter-layer insulating film 350. An aluminum line 348 is formed on the inter-layer insulating film 350. The aluminum line 348 is also formed inside the through hole 344 and electrically connected to the source/drain 336a.

Next, details of the second region 312 are explained. The MOS field-effect transistor 315 includes a gate electrode 360 and source/drain 354 and 356. A buried oxide film 318 is formed on the silicon substrate 314 in the second region 312. A silicon single-crystal layer is formed on the buried oxide film 318. A p-type body region 352 and n-type source/drain 354 and 356 are formed in this silicon single-crystal layer. Element separation LOCOS oxide films 326 and 328 are formed on the buried oxide film 318. The MOS field-effect transistor 315 is insulated and separated from other elements by the element separation LOCOS oxide films 326 and 328.

A gate oxide film 358 is formed on the body region 352. The thickness of the gate oxide film 358 is, for example, 3 to 10 nm. An inter-layer insulating film 350 is formed above the silicon substrate 314 so as to cover the gate electrode 360. A through hole 362 for exposing the source/drain 354 is formed in the inter-layer insulating film 350. An aluminum line 366 is formed on the inter-layer insulating film 350. The aluminum line 366 is also formed inside the through hole 362 and electrically connected to the source/drain 354. A through hole 364 for exposing the source/drain 356 is formed in the inter-layer insulating film 350. An aluminum line 368 is formed on the inter-layer insulating film 350. The aluminum line 368 is also formed inside the through hole 364 and electrically connected to the source/drain 356.

That is, it is possible in the semiconductor device 300 to form both a high voltage MOSFET requiring a deep diffusion layer and a MOSFET having an SOI structure in the same substrate.

Further, a drive circuit capable of controlling a slew rate with ease while preventing the increase in the circuit size has been proposed (Patent literature 2). Further, semiconductor devices of similar types have been disclosed (Patent literatures 3 and 4).

CITATION LIST

Patent Literature

Patent literature 1: Japanese Unexamined Patent Application Publication No. 2001-7219
Patent literature 2: Japanese Unexamined Patent Application Publication No. 8-102498
Patent literature 2: Japanese Unexamined Patent Application Publication No. 2008-227084
Patent literature 4: Japanese Unexamined Patent Application Publication No. 2007-201240

SUMMARY OF INVENTION

Technical Problem

However, the inventor has found that there is the following problem in the above-described semiconductor device. In general, when a MOSFET having an SOI structure is used for reducing the parasitic capacitance and/or for high frequency use, it is required to suppress the effects caused by the support substrate. Therefore, the buried oxide film (BOX) layer needs to be formed with a large thickness. When a MOSFET having a thick buried oxide film layer is manufactured, a high difference in height is generated between the combined structure of the SOI substrate and the BOX layer and the support substrate as in the case of the semiconductor device 300 shown in FIG. 5. As a result, the focus is deviated in the lithography process due to the difference in height, and thereby deteriorating the accuracy in dimensions of the device. Further, this also leads to the occurrence of unremoved films at the height-difference part and makes the etching conditions more complicated in the dry-etching process. Therefore, restrictions on devices that can be manufactured and the reduction in yield are unavoidable in the above-described semiconductor device.

Solution to Problem

A semiconductor device according to an aspect of the present invention includes: a first MOSFET formed on a high-resistance substrate; and a second MOSFET that is monolithic-integrated with the first MOSFET on the high-resistance substrate, in which the first MOSFET includes: a first semiconductor layer formed on the high-resistance substrate; and a second semiconductor layer formed above the first semiconductor layer, the second semiconductor layer serving as a well layer of the first MOSFET, and the second MOSFET includes: a first insulating layer formed on the high-resistance substrate, first insulating layer being sandwiched between two trenches and thus having a mesa-shape in its upper part, an upper surface of the mesa-shape being positioned at the same height as the first semiconductor layer; a second insulating layer formed on the mesa-shape of the first insulating layer; and a third semiconductor layer formed on the second insulating layer, the third semiconductor layer serving as a well layer of the second MOSFET. In this way, even if the first insulating layer is formed, the first insulating layer does not protrude upward beyond the second semiconductor layer. Therefore, it is possible to reduce the difference in height that is generated between the first and second MOSFETs.

A semiconductor device according to an aspect of the present invention includes: a first MOSFET formed on a high-resistance substrate; and a second MOSFET that is monolithic-integrated with the first MOSFET on the high-resistance substrate, in which the first MOSFET includes: a first semiconductor layer formed on the high-resistance substrate; and a second semiconductor layer formed above the first semiconductor layer, the second semiconductor layer serving as a well layer of the first MOSFET, and the second MOSFET includes: a first insulating layer formed on the high-resistance substrate, the first insulating layer having a mesa-shape in its upper part, the mesa-shape being formed by forming trenches in the first semiconductor layer and then performing oxidation treatment from a side and a bottom of the trenches and thereby being sandwiched between two trenches: a second insulating layer formed on the mesa-shape of the first insulating layer; and a third semiconductor layer formed on the second insulating layer, the third semiconductor layer serving as a well layer of the second MOSFET. In this way, even if the first insulating layer is formed, the first insulating layer does not protrude upward beyond the second semiconductor layer. Therefore, it is possible to reduce the difference in height that is generated between the first and second MOSFETs.

A manufacturing method of a semiconductor device according to an aspect of the present invention includes: forming a first semiconductor layer on a high-resistance substrate; forming a second insulating layer on the first semiconductor layer; forming a third semiconductor layer on the second insulating layer, the third semiconductor layer serving as a well layer of a second MOSFET; removing the second insulating layer and the third semiconductor layer in a first region and forming an opening in the second insulating layer and the third semiconductor layer in a second region; forming trenches by etching the first semiconductor layer in the opening formed in the second insulating layer and the third semiconductor layer in the second region, and thereby forming a mesa-shape sandwiched between two trenches in the first semiconductor layer located below the second insulating layer and the third semiconductor layer; forming a first insulating layer by performing oxidation treatment from a side and a bottom of the trenches, the first insulating layer being sandwiched between two trenches and thus having a mesa-shape in its upper part; and forming a second semiconductor layer above the first semiconductor layer in the first region, the second semiconductor layer serving as a well layer of a first MOSFET. In this way, even if the first insulating layer is formed, the first insulating layer does not protrude upward beyond the second semiconductor layer. Therefore, it is possible to reduce the difference in height that is generated between the first and second MOSFETs.

Advantageous Effects of Invention

According to the present invention, it is possible to provide a semiconductor device and its manufacturing method in which a transistor to be formed on an insulating layer can be suitably monolithic-integrated.

BRIEF DESCRIPTION OF DRAWINGS

FIG. 2I is a cross section schematically showing a manufacturing method of a semiconductor device 100 according to a first embodiment;

FIG. 2O is a cross section schematically showing a manufacturing method of a semiconductor device 100 according to a first embodiment;

FIG. 3 is a cross section schematically showing a manufacturing method of a semiconductor device 200 according to a second embodiment;

DESCRIPTION OF EMBODIMENTS

Example 1

Embodiments according to the present invention are explained hereinafter with reference to the drawings. The same symbols are assigned to the same components throughout the drawings, and their duplicated explanation is omitted as necessary.

First Embodiment

Figure 1:
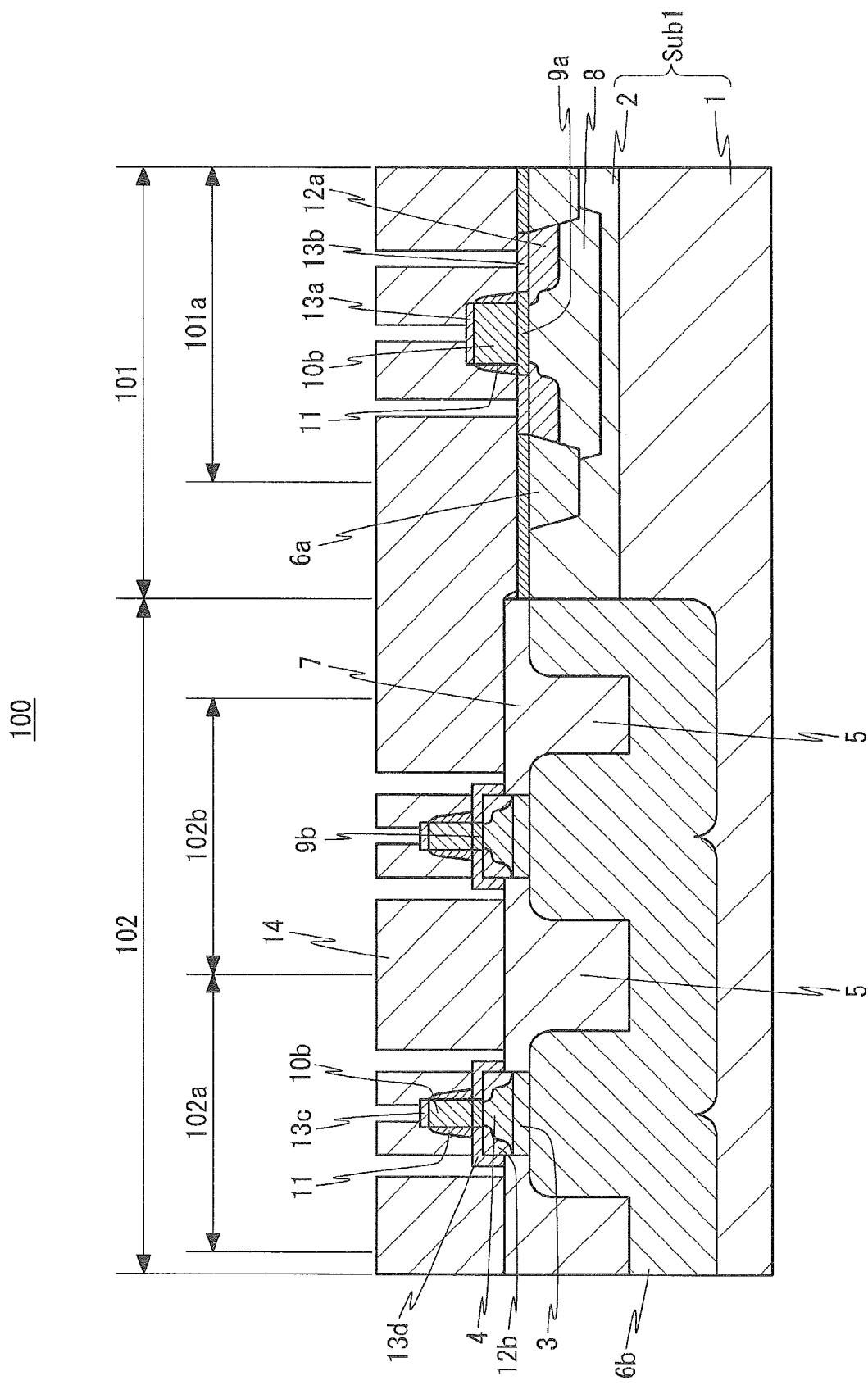
FIG. 1 is a cross section schematically showing a structure of a semiconductor device 100 according to a first embodiment.

A semiconductor device 100 according to a first embodiment of the present invention is explained. FIG. 1 is a cross section schematically showing a structure of a semiconductor device 100 according to the first embodiment. The semiconductor device 100 includes a logic circuit region 101 and a switch circuit region 102 that are monolithic-integrated on a high-resistance substrate 1. As shown in FIG. 1, for example, a logic MOSFET 101a is formed in the logic circuit region 101. Switch MOSFETs 102a and 102b are formed in the switch circuit region 102.

In the logic circuit region 101, an epitaxial layer 2 is formed on the high-resistance substrate 1. The high-resistance substrate 1 is made of, for example, silicon having a specific resistance of $\rho s=10\,k\Omega\cdot cm$. The epitaxial layer is made of, for example, n-type silicon having a specific resistance of $\rho e=10$ to $20\,k\Omega\cdot cm$. LOCOS oxide films 6a, which are insulating layers, are formed above the epitaxial layer 2. A well layer 8 made of p-type silicon, for example, is formed between two LOCOS oxide films 6a. The logic MOSFET 101a is formed on the well layer 8. Note that the part of the epitaxial layer 2 on which no well layer 8 is formed and the LOCOS oxide films 6a are covered by a gate oxide film 9a.

A structure of the logic MOSFET 101a is explained. Two n-type diffusion layers 12a, for example, are formed in the upper part of the well layer 8. The two diffusion layers 12a serve as the source and the drain, respectively, of the logic MOSFET 101a. A gate oxide film 9a, which is an insulating film, is formed between the two diffusion layers 12a. The gate oxide film 9a is formed between the well layer 8 and the gate electrode 10a. Note that the gate electrode 10a is made of, for example, polysilicon, and the gate oxide film 9a is composed of a silicon oxide film. A silicide 13a is formed on the gate oxide film 10a. Silicides 13b are formed on the diffusion layers 12a. The sidewall of the gate oxide film 10a is covered by a sidewall 11. Further, an inter-layer insulating film 14, which covers the logic MOSFET 101a, is formed. A contact hole is formed in the inter-layer insulating film 14 above each of the silicides 13a and 13b.

In the switch circuit region 102, an LOCOS oxide film 6b, which is an insulating layer, is formed on the high-resistance substrate 1. Trenches 5 are formed in the LOCOS oxide film 6b. As a result, an upper part of the LOCOS oxide film, which is sandwiched between the trenches 5, has a mesa-shape. The trenches 5 are filled with an oxide film 7.

A structure of the switch MOSFET 102a is explained. A buried oxide film 3 (thickness of 0.1 to 0.4 μm) and an SOI layer 4 (thickness no greater than 0.1 μm) are formed on the LOCOS oxide film 6b. The buried oxide film 3, which is an insulating layer, is made of, for example, silicon oxide, and the SOI layer 4 is made of, for example, silicon. Diffusion layers 12b are formed in the upper part of the SOI layer 4. The two diffusion layers 12b serve as the source and the drain, respectively, of the switch MOSFET 102a. A gate oxide film 9b, which is an insulating film, is formed between the upper surface of the SOI layer and a gate electrode 10b. Note that the gate electrode 10b is made of, for example, polysilicon, and the gate oxide film 9b is made of silicon oxide. A silicide 13c is formed on the gate oxide film 10b. Silicides 13d are formed on the diffusion layers 12b. The sidewall of the gate electrode 10b is covered by a sidewall 11. Further, an inter-layer insulating film 14, which covers the switch MOSFET 102a, is formed. A contact hole is formed in the inter-layer insulating film 14 above each of the silicides 13c and 13d. Note that the structure of a switch MOSFET 102b is similar to that of the switch MOSFET 102a, and therefore its explanation is omitted.

Note that in the semiconductor device 100, the logic circuit region 101 corresponds to the first region and the switch circuit region 102 corresponds to the second region. The logic MOSFET 101a corresponds to the first MOSFET and the switch MOSFETs 102a and 102b correspond to the second MOSFET. The epitaxial layer 2, the well layer 8, the SOI layer 4, and an interface carrier suppression layer 15 correspond to the first to fourth semiconductor layers respectively. The LOCOS oxide film 6b and the buried oxide film 3 correspond to the first and second oxide films respectively. The gate oxide films 9a and 9b correspond to the first and second gate insulating films respectively. The diffusion layers 12a correspond to the first and second diffusion layers. The diffusion layers 12b correspond to the third and fourth diffusion layers. The LOCOS oxide films 6a correspond to the first and second element separations. The above-described correlations between the terms are also applied to the following explanation.

Figure 2A:
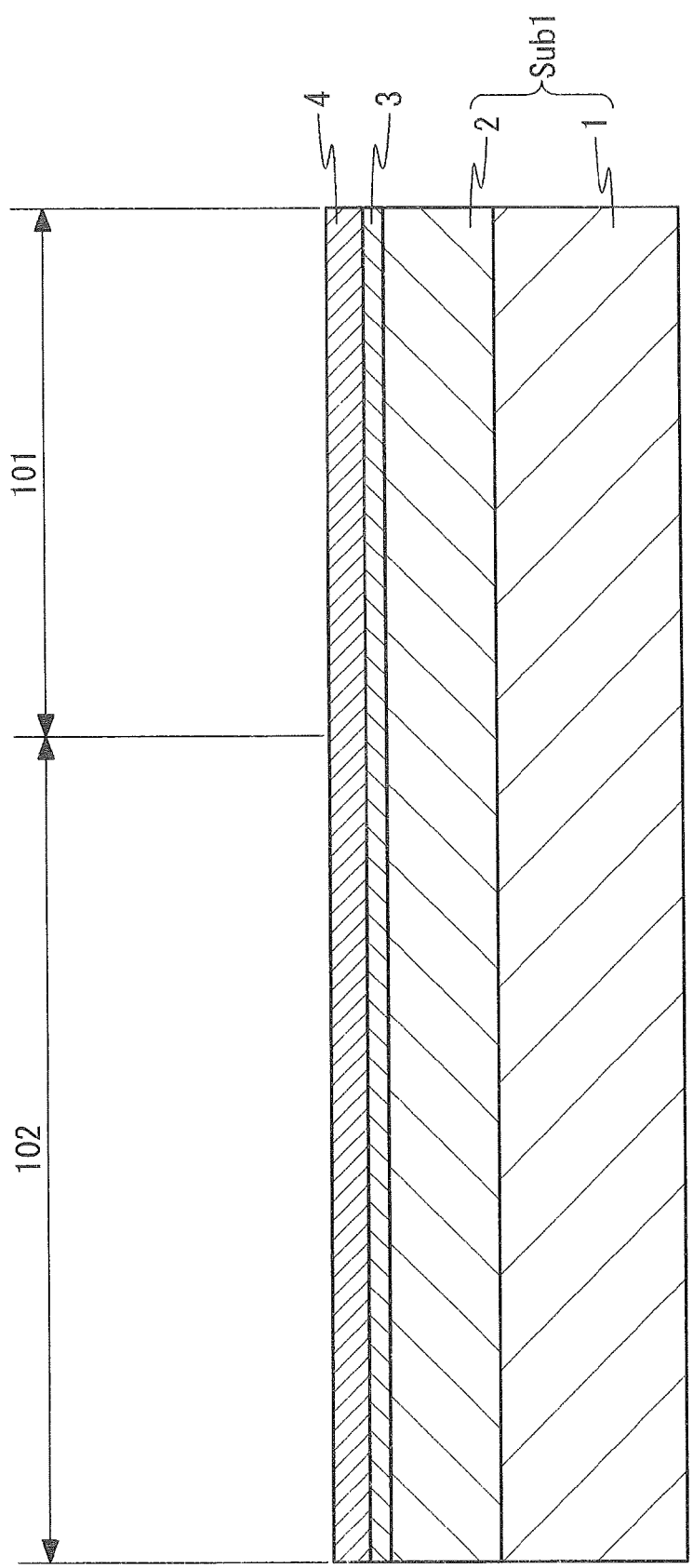
FIG. 2A is a cross section schematically showing a manufacturing method of a semiconductor device 100 according to a first embodiment.
Figure 2B:
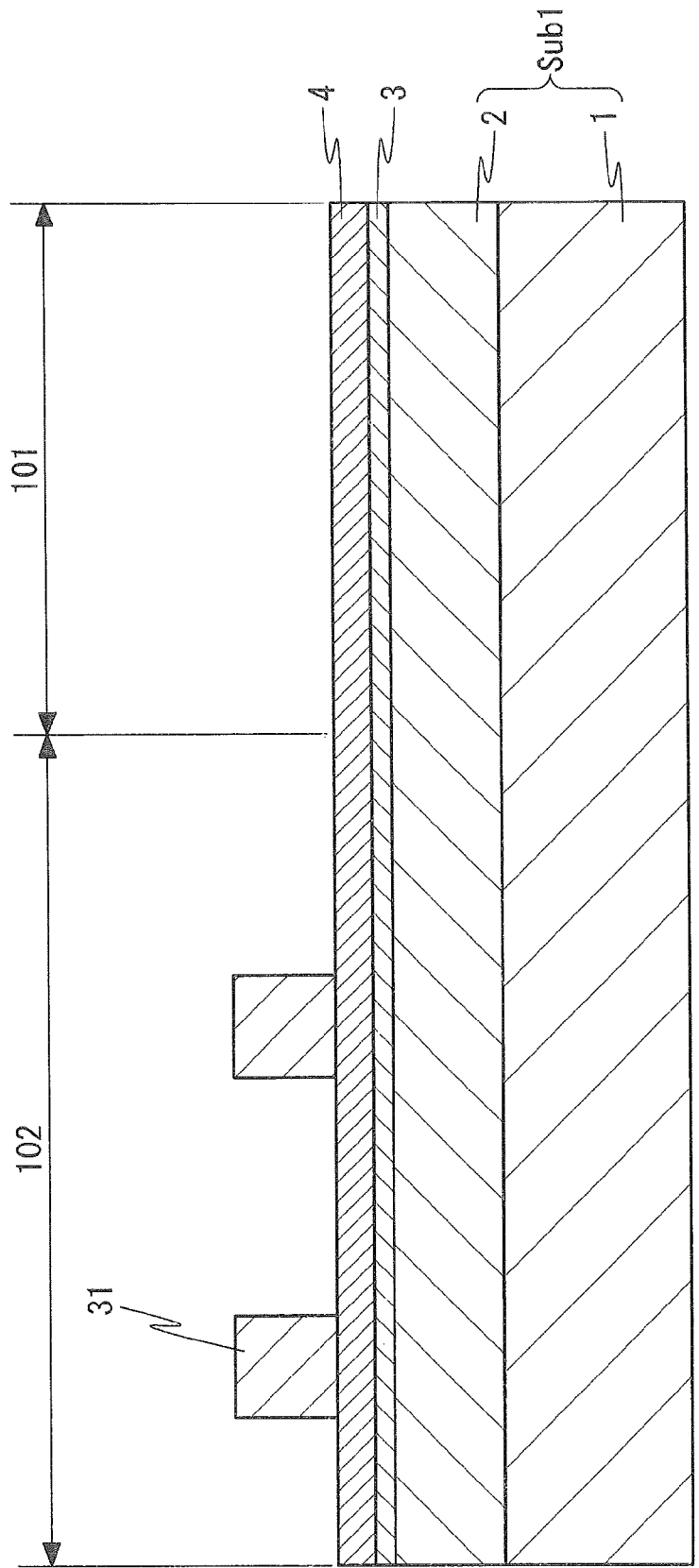
FIG. 2B is a cross section schematically showing a manufacturing method of a semiconductor device 100 according to a first embodiment.
Figure 2C:
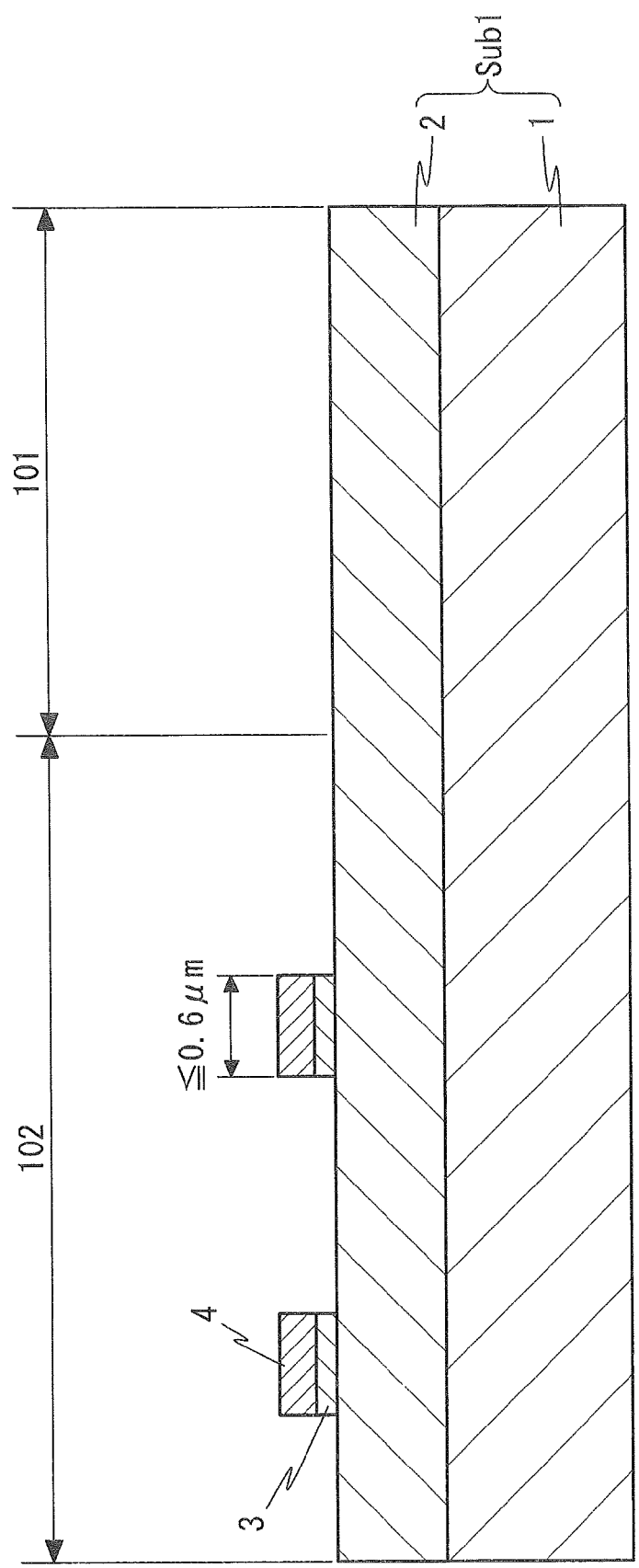
FIG. 2C is a cross section schematically showing a manufacturing method of a semiconductor device 100 according to a first embodiment.
Figure 2D:
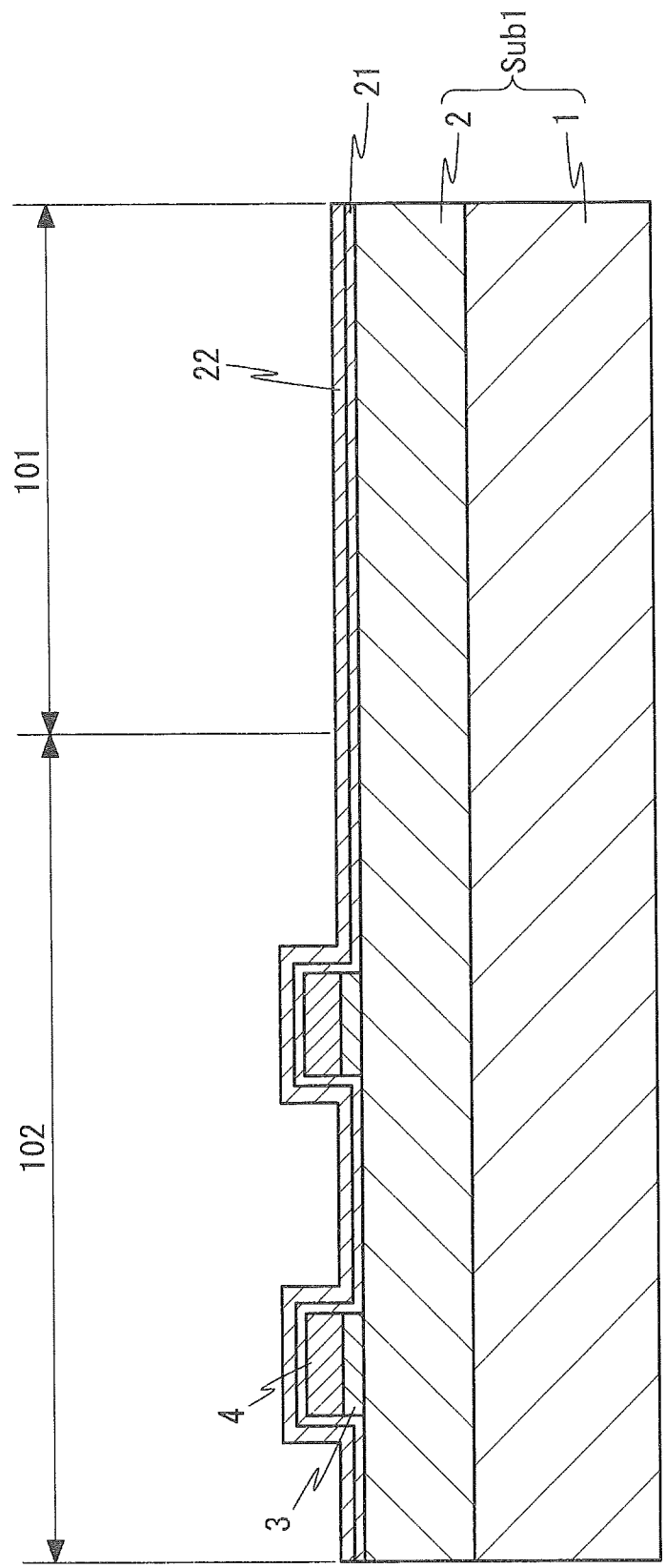
FIG. 2D is a cross section schematically showing a manufacturing method of a semiconductor device 100 according to a first embodiment.
Figure 2E:
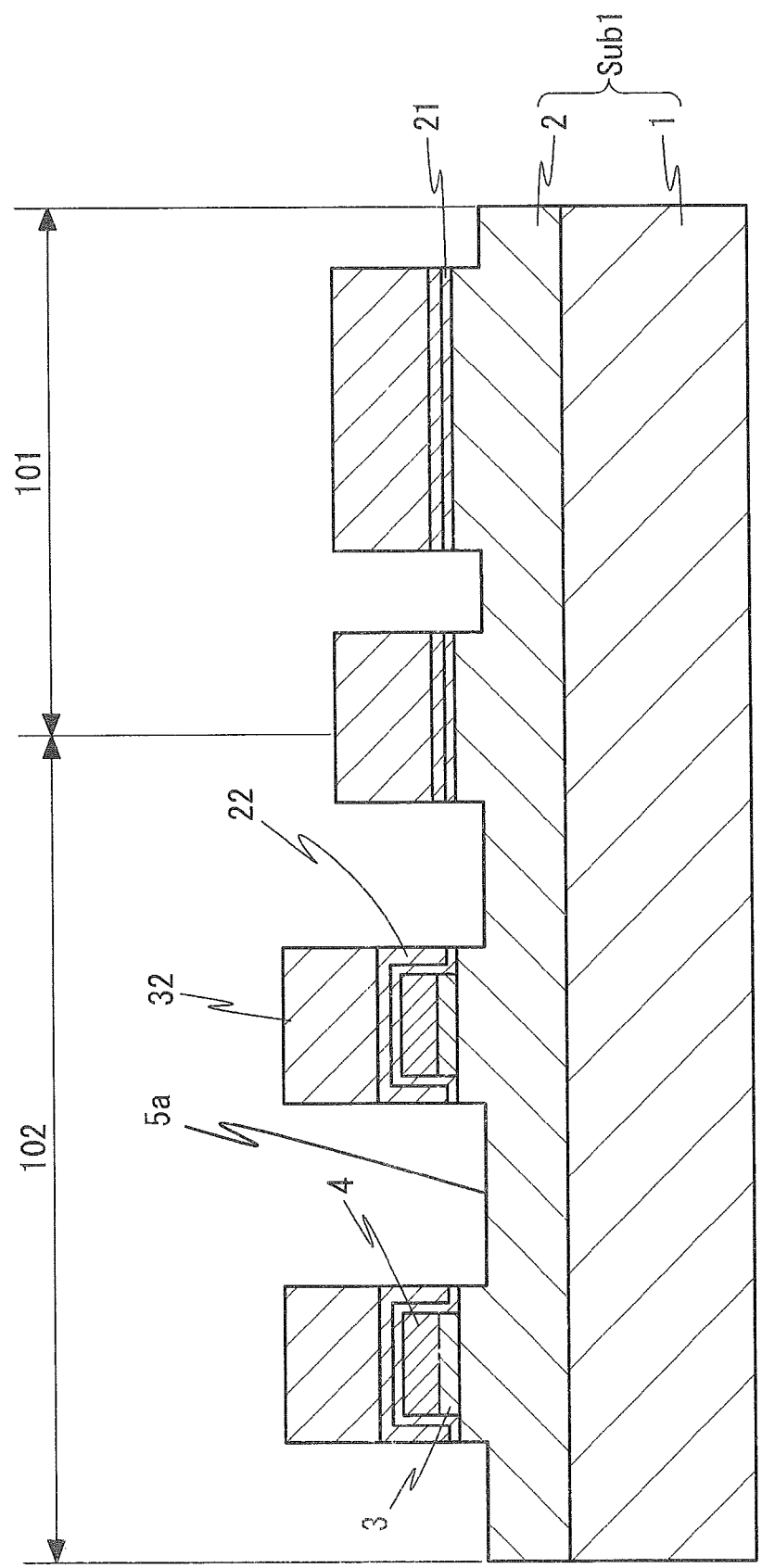
FIG. 2E is a cross section schematically showing a manufacturing method of a semiconductor device 100 according to a first embodiment.
Figure 2F:
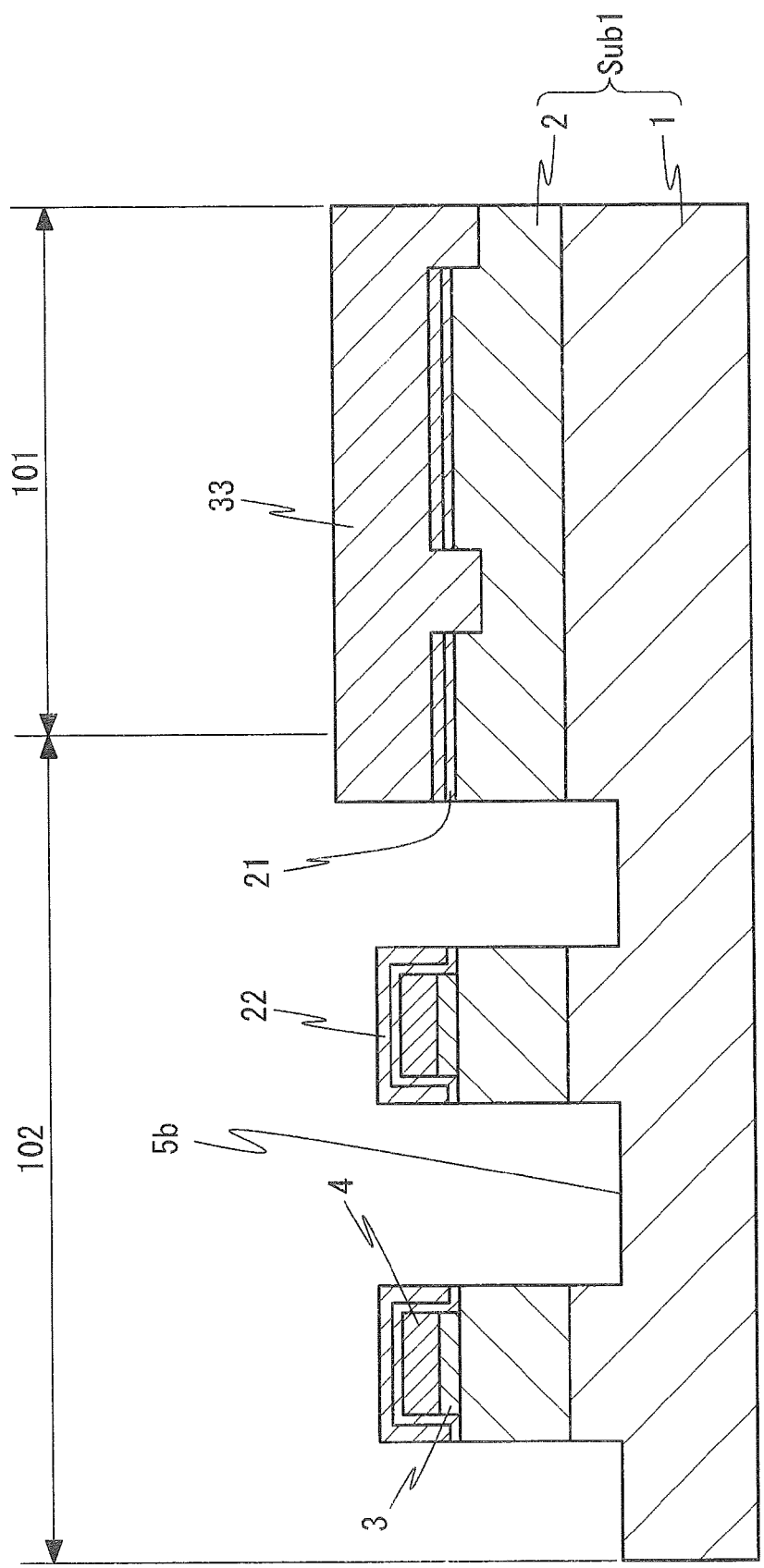
FIG. 2F is a cross section schematically showing a manufacturing method of a semiconductor device 100 according to a first embodiment.
Figure 2G:
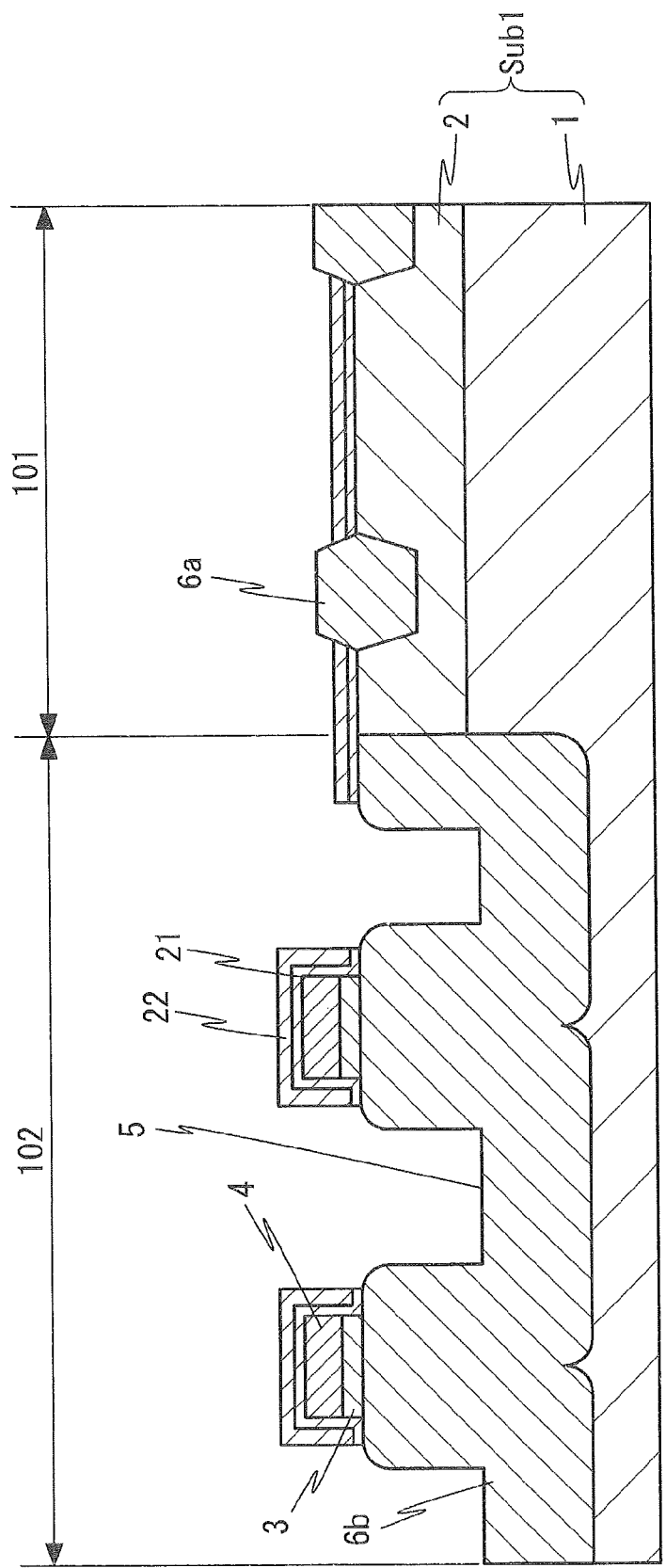
FIG. 2G is a cross section schematically showing a manufacturing method of a semiconductor device 100 according to a first embodiment.
Figure 2H:
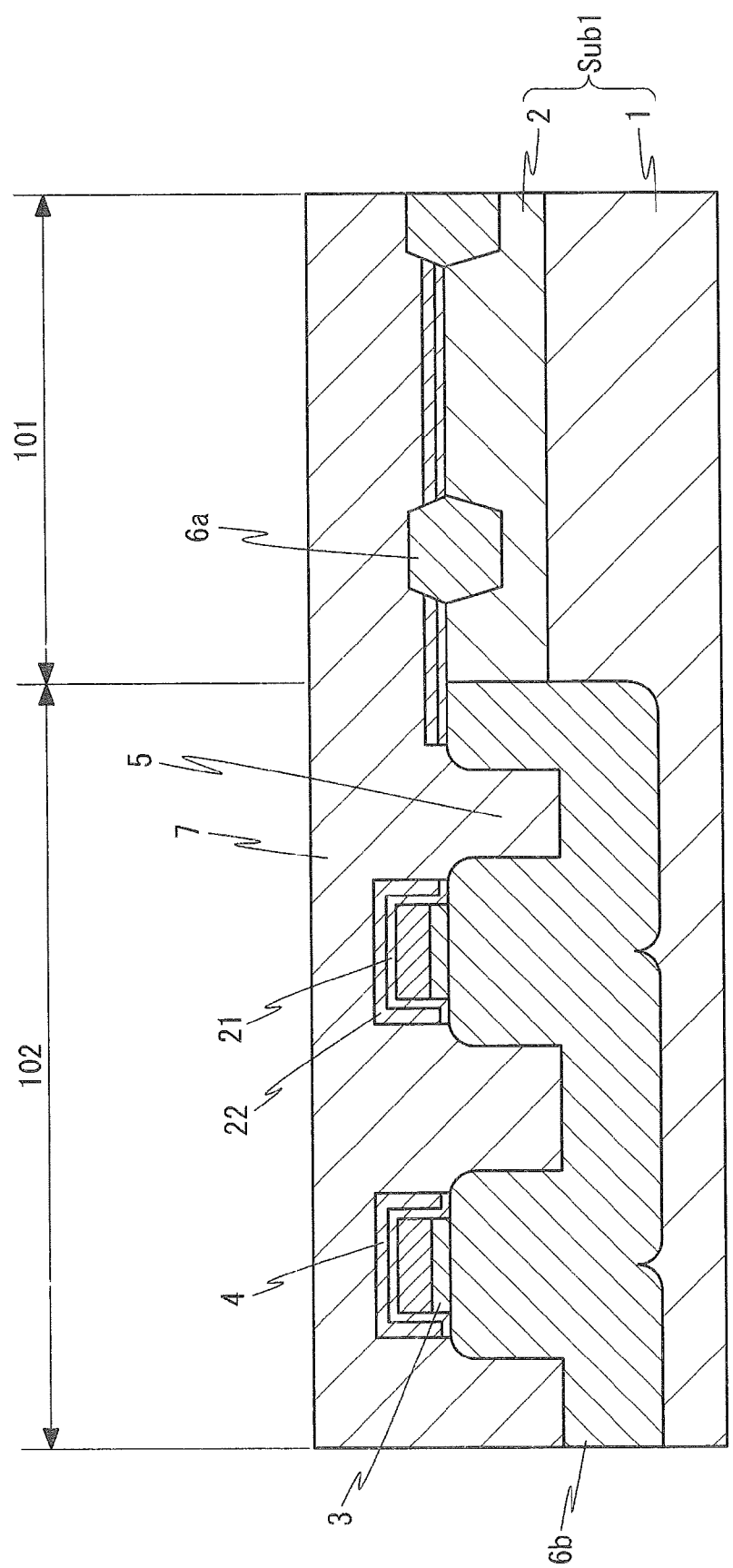
FIG. 2H is a cross section schematically showing a manufacturing method of a semiconductor device 100 according to a first embodiment.
Figure 21:
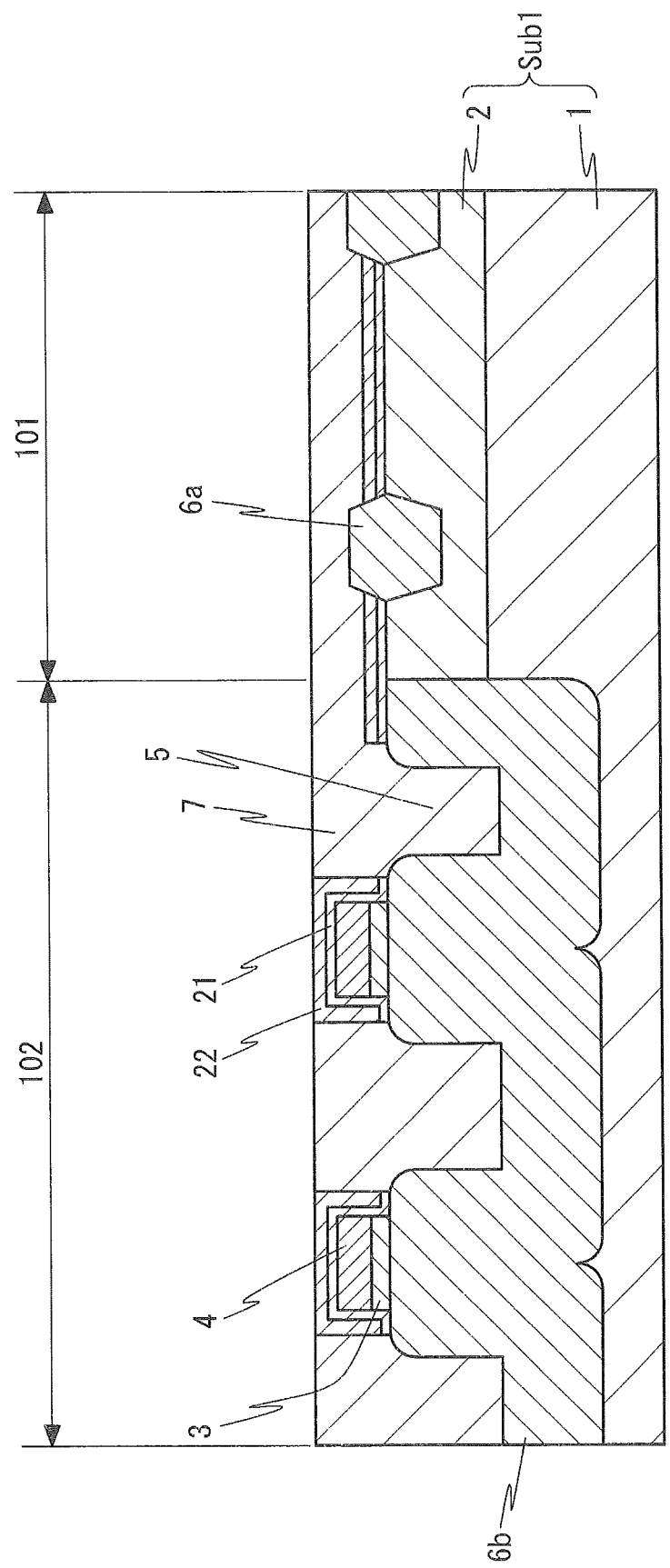
Figure 2J:
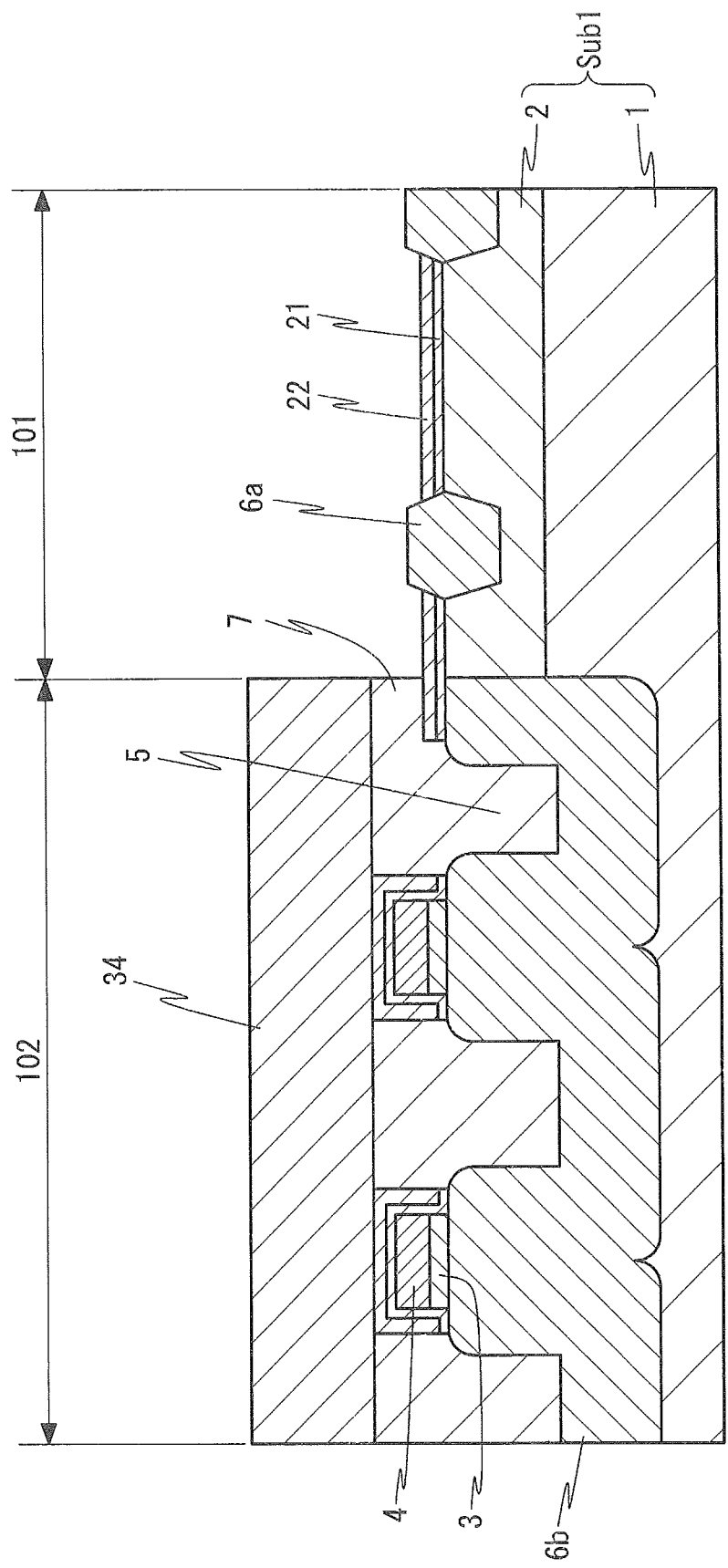
FIG. 2J is a cross section schematically showing a manufacturing method of a semiconductor device 100 according to a first embodiment.
Figure 2K:
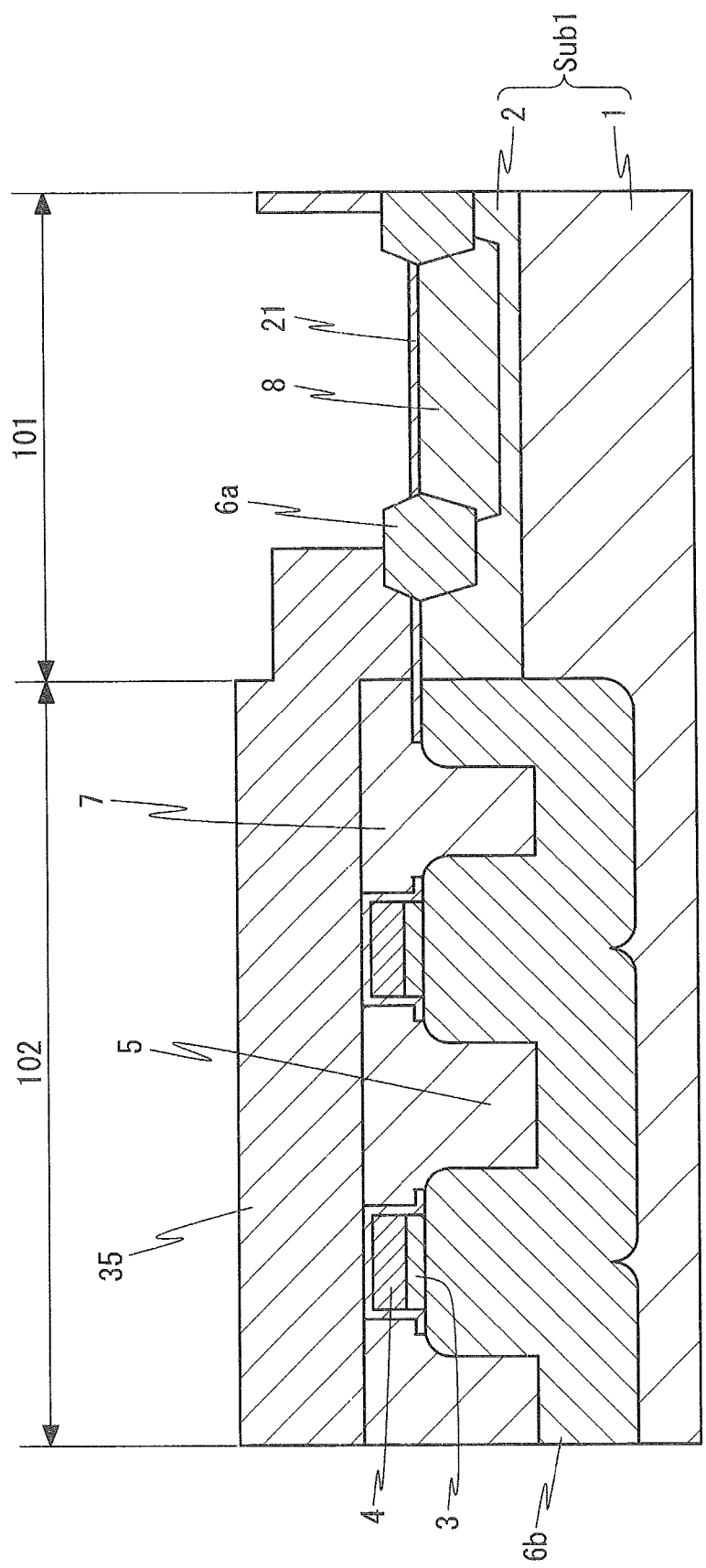
FIG. 2K is a cross section schematically showing a manufacturing method of a semiconductor device 100 according to a first embodiment.
Figure 2L:
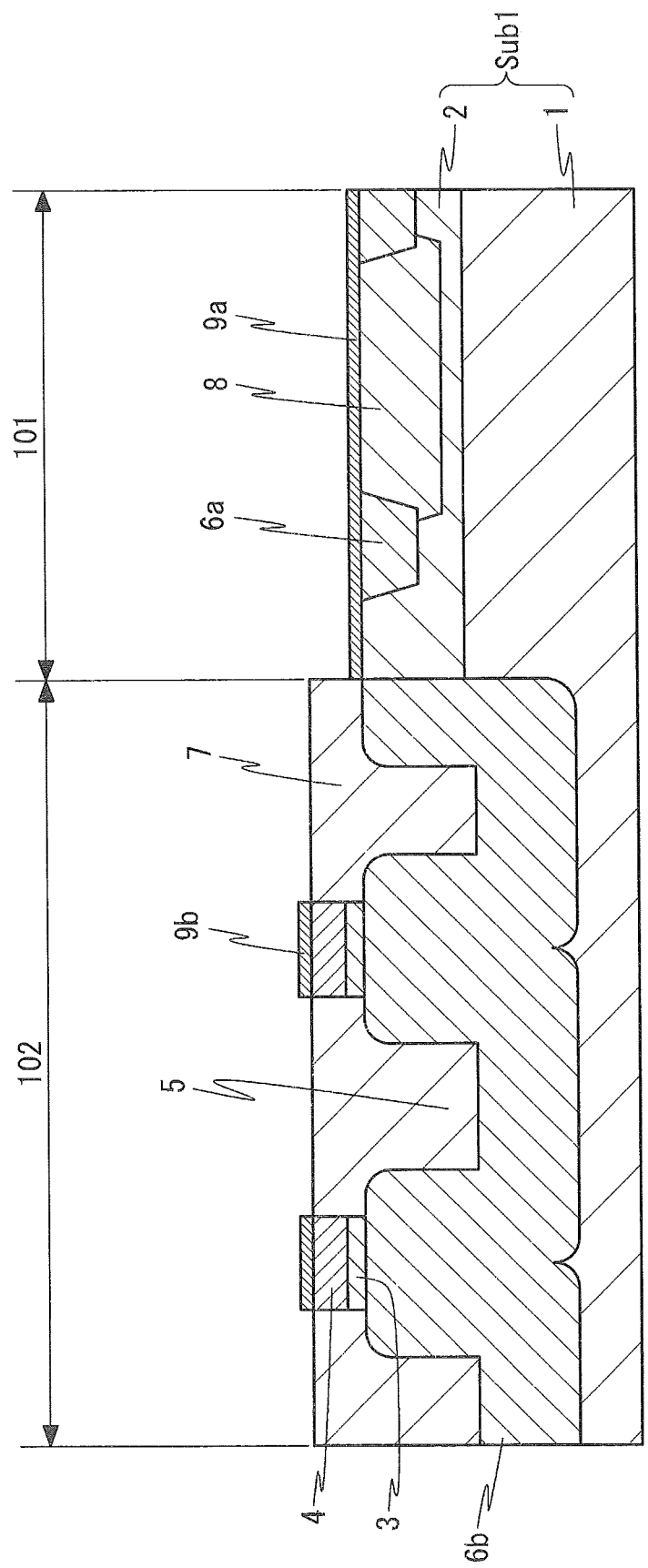
FIG. 2L is a cross section schematically showing a manufacturing method of a semiconductor device 100 according to a first embodiment.
Figure 2M:
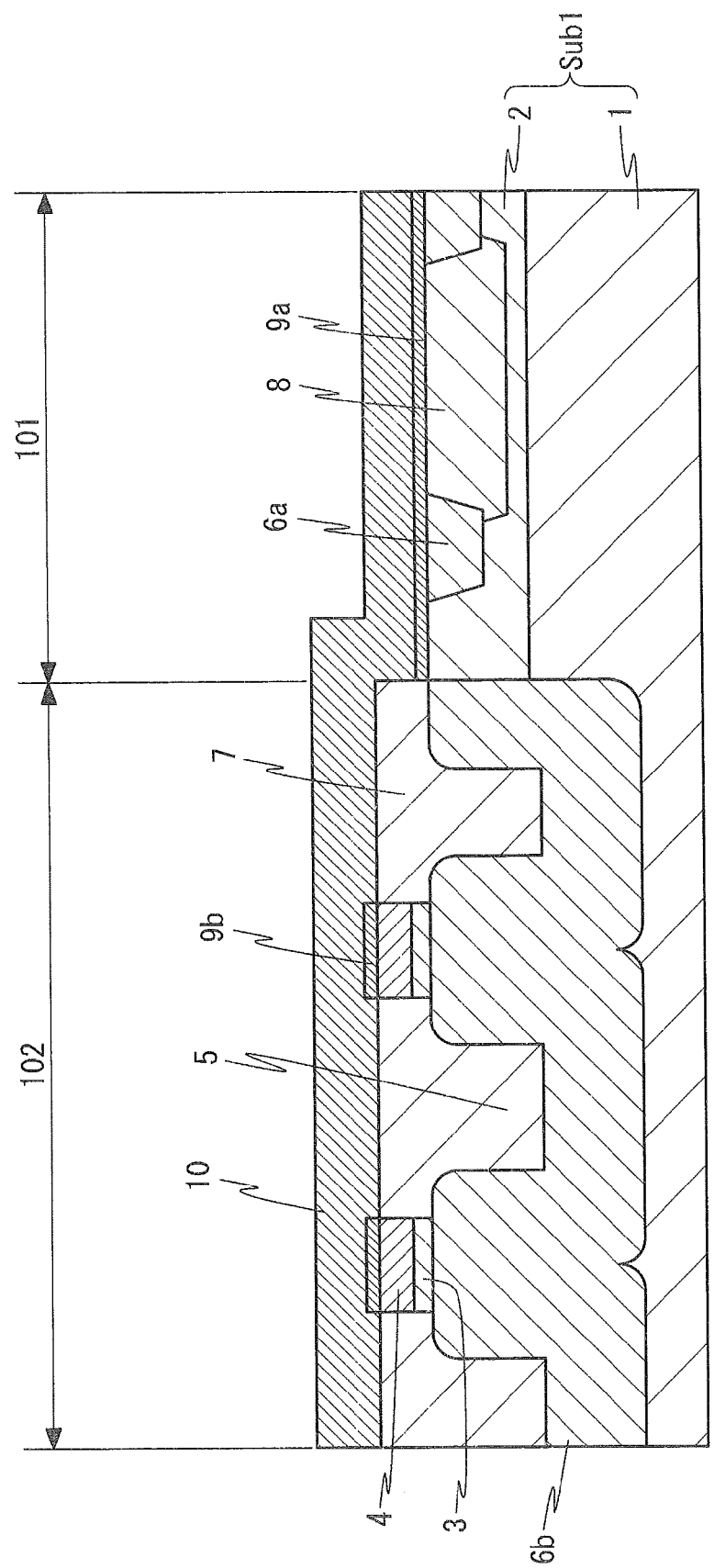
FIG. 2M is a cross section schematically showing a manufacturing method of a semiconductor device 100 according to a first embodiment.
Figure 2N:
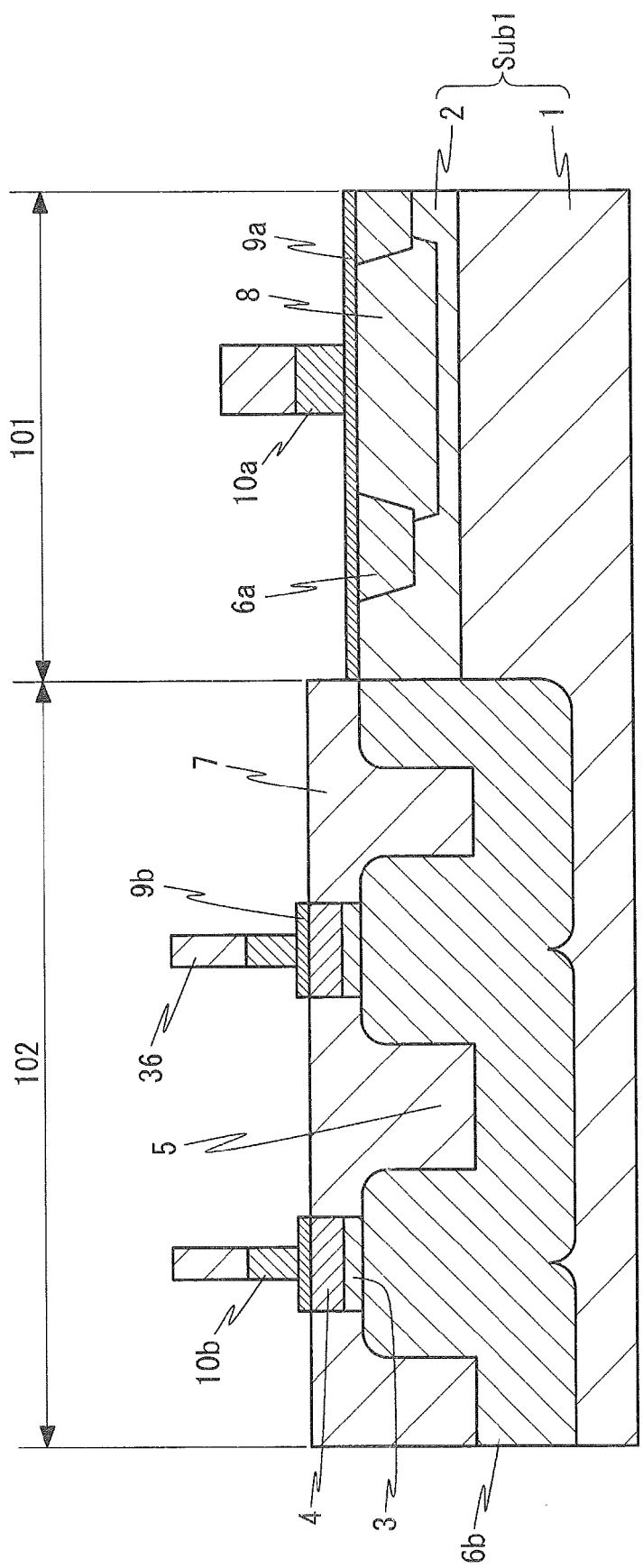
FIG. 2N is a cross section schematically showing a manufacturing method of a semiconductor device 100 according to a first embodiment.
Figure 20:
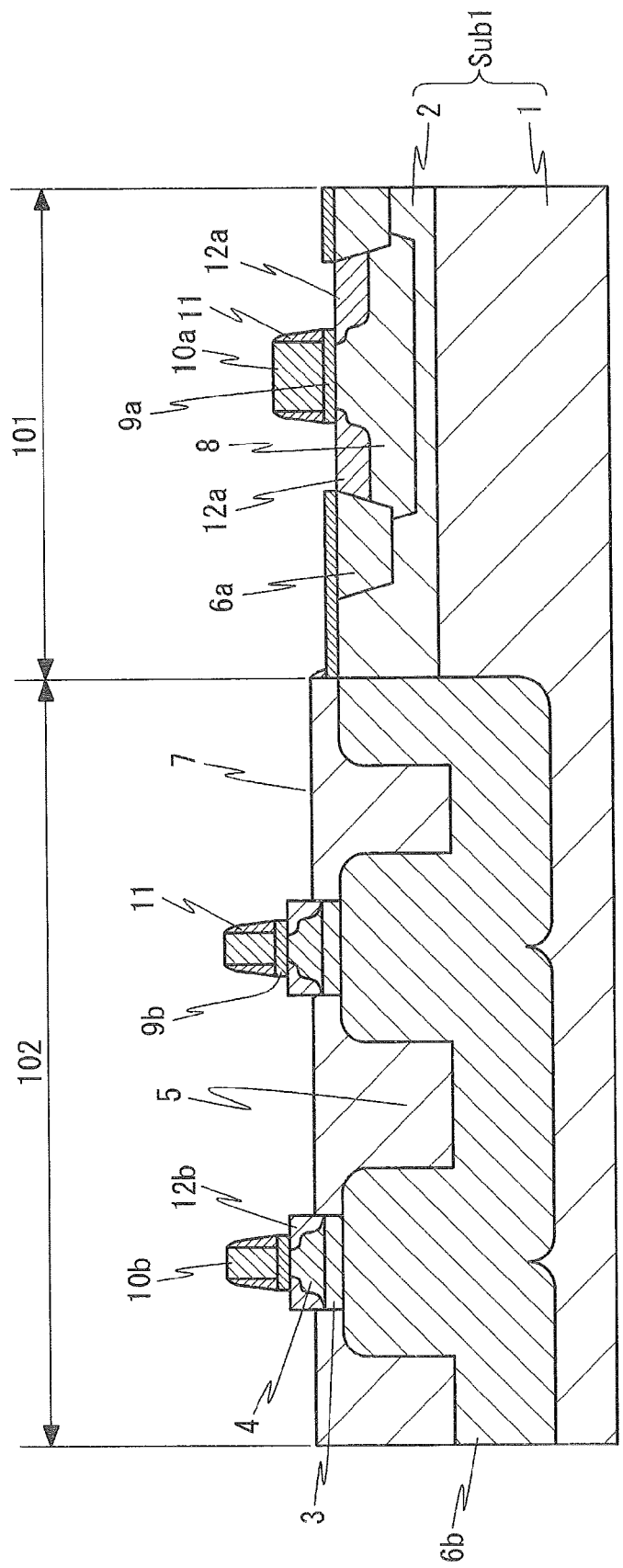
Figure 2P:
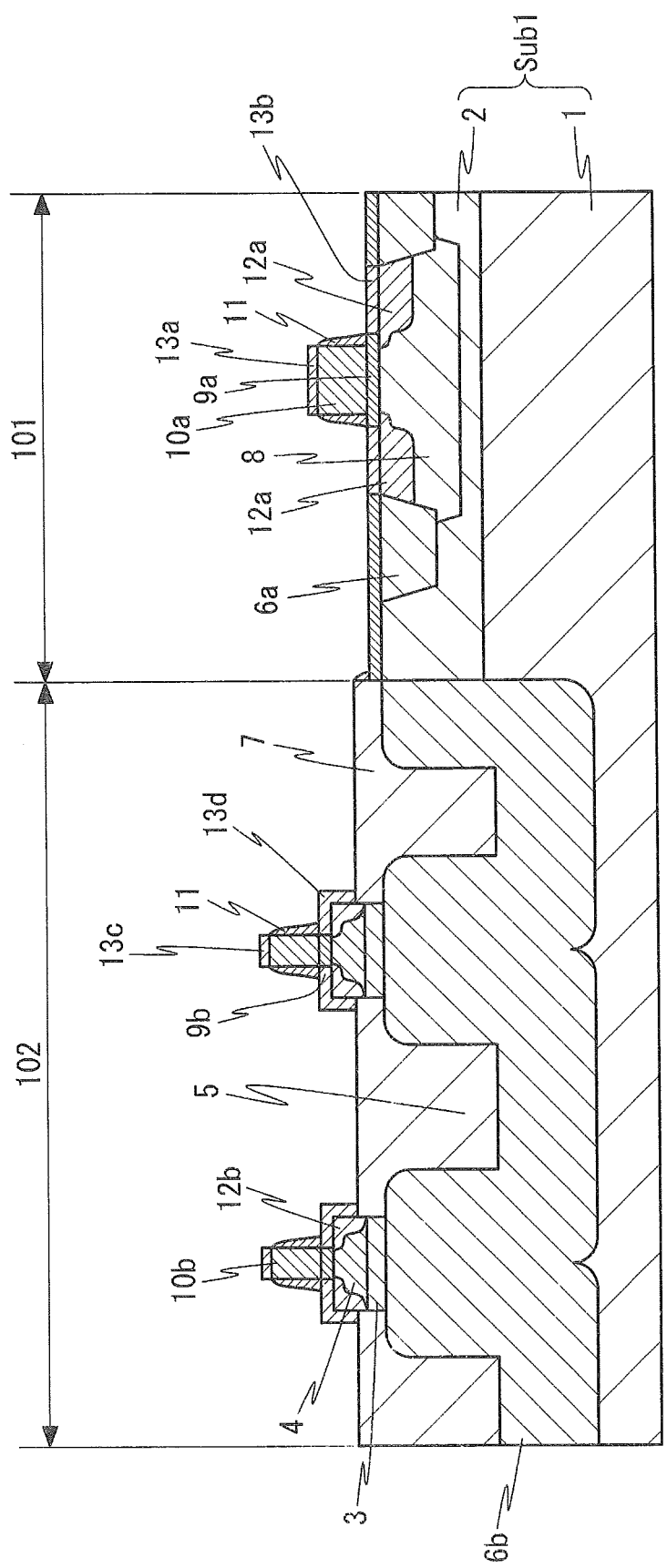
FIG. 2P is a cross section schematically showing a manufacturing method of a semiconductor device 100 according to a first embodiment.

Next, a manufacturing method of the semiconductor device 100 is explained. FIGS. 2A to 2P are cross sections schematically showing a manufacturing method of the semiconductor device 100. Firstly, an epitaxial layer 2 is formed on a high-resistance substrate 1 by, for example, MOCVD (Metal Organic Chemical Vapor Deposition) or the like. Then, a buried oxide film 3 and an SOI layer 4 are formed by wafer bonding using a smart-cut method, and thereby manufacturing an SOI substrate (FIG. 2A).

Next, a photoresist 31 is formed by photo lithography. The photoresist 31 has openings in the switch circuit region 102. Further, no photoresist 31 is formed in the logic circuit region 101 (FIG. 2B). Then, dry-etching is performed by using the photoresist 31 as a mask and the buried oxide film 3 and the SOI layer 4 are thereby removed. After the etching is finished, the photoresist 31 is removed. Note that the width of the remaining buried oxide film and the SOI layer 4 is no greater than 0.6 μm (FIG. 2C).

Next, an oxide film 21 and a nitride film 22, which are used as masks in subsequent processes, are formed in the logic circuit region 101 and the switch circuit region 102. For example, a silicon oxide can be used for the oxide film 21 and a silicon nitride can be used for the nitride film 22. Each of the oxide film 21 and the nitride film 22 can be formed by, for example, a plasma CVD method (FIG. 2D).

Next, a mask pattern used for LOCOS oxide film formation is formed. Specifically, a photoresist 32 is formed by photo lithography. The photoresist 32 is formed above the buried oxide film 3 and the SOI layer 4 remaining in the switch circuit region 102. Further, an opening(s) is formed in the part of the photoresist 32 in which an element separation in the polysilicon film 10 is to be formed. Then, nitride film dry-etching and oxide film dry-etching are performed by using the photoresist 32 as a mask, and the buried oxide film 3 and the SOI layer 4 located inside the openings of the photoresist 32 are thereby removed. Next, silicon dry-etching is performed and trenches 5a are formed in the epitaxial layer 2. Note that this etching is performed in such a manner that the trenches 5a do not penetrate the epitaxial layer 2 (FIG. 2E).

After the above-described etching is finished, the photoresist 32 is removed. After the photoresist 32 is removed, a photoresist 33 is formed by photo lithography. The photoresist 33 is formed so as to cover the logic circuit region 101. Note that no photoresist 33 is formed in the switch circuit region 102. Then, silicon dry-etching is performed by using the photoresist 33 and the nitride film 22 as masks, and trenches 5b in the switch circuit region 102 are thereby formed in such a manner the trenches 5b penetrate the epitaxial layer 2 and reaches the high-resistance substrate 1 (FIG. 2F).

After the above-described etching is finished, the photoresist 33 is removed. After the photoresist 33 is removed, LOCOS oxidation is performed and LOCOS oxide films 6a and 6b are thereby formed. In the switch circuit region 102, the oxidation spreads from the bottom (downward) and the side (horizontal direction) of the trenches. That is, since the oxidation spreads in the horizontal direction, the epitaxial layer 2 located below the buried oxide film 3 and the SOI layer 4 are entirely oxidized. Since the oxidation spreads downward, the high-resistance substrate 1 is oxidized in the bottom direction. As a result, the thickness of the LOCOS oxide film 6b from the bottom to the buried oxide film 3 becomes a sufficient thickness equal to or greater than 2.0 μm. Note that when LOCOS oxidation is performed, the volume increases in comparison to before the oxidation. Therefore, the LOCOS oxide film 6b located below the buried oxide film 3 and the SOI layer 4 expands in the horizontal direction. Meanwhile, in the logic circuit region 101, the oxidation of the trench parts advances and LOCOS oxide films 6a are thereby formed. Note that the LOCOS oxide films 6a are formed into such a shape that the LOCOS oxide film 6a swells beyond the upper surface of the nitride film 22 due to the volume expansion (FIG. 2G).

Next, an oxide film 7 is formed. For example, the oxide film may be a silicon oxide and can be formed by using a plasma CVD method (FIG. 2H). Then, a flattening process is performed and the part of the oxide film 7 that is located above the nitride film 22 is thereby removed. Note that the oxide film 7 is flattened by CMP (Chemical Mechanical Polishing) or etch back (FIG. 2I). After the flattening process is finished, a photoresist 34 is formed by photo lithography. The photoresist 34 is formed so as to cover the switch circuit region 102 but is not formed on the logic circuit region 101. Then, for example, wet-etching is performed by using the photoresist 34 as a mask and the oxide film 7 remaining in the logic circuit region 101 is removed (FIG. 2J).

Next, a well layer 8 in the logic circuit region 101 is formed. Firstly, the nitride film is removed by wet-etching. Note that some of the nitride film 22 may remain on the side of the buried oxide film 3 and the SOI layer 4 through the oxide film 21. However, the illustration of remaining nitride film 22 is omitted in subsequent figures for simplifying the figures. Next, a photoresist 35 is formed by photo lithography. The photoresist 35 covers the switch circuit region 102, and an opening is formed in the photoresist 35 in a region where the well layer 8 in the logic circuit region 101 is to be formed. The well layer 8 is formed in a region sandwiched between the LOCOS oxide films 6a, which function as element separations. Therefore, the opening is formed in the region sandwiched between the LOCOS oxide films 6a. Then, ion implantation is performed by using the photoresist 35 as a mask and the well layer 8 is thereby formed (FIG. 2K).

After the ion implantation is finished, the photoresist 35 is removed. Then, the oxide film and the part of the LOCOS oxide films 6a protruding above the epitaxial layer 2 are removed by, for example, wet-etching. Note that some of the oxide film 21 may remain on the side of the buried oxide film 3 and the SOI layer 4. However, the illustration of remaining oxide film 21 is omitted in subsequent figures for simplifying the figures. After that, gate oxidation is performed, so that a gate oxide film 9a is formed on the logic circuit region 101 and gate oxide films 9b are formed on the SOI layer 4 (FIG. 2L).

Next, gate electrodes are formed. Firstly, a polysilicon film 10, which is the material for the gate electrode, is formed in the logic circuit region 101 and the switch circuit region 102. The polysilicon film 10 can be formed by, for example, an LPCVD (Low Pressure Chemical Vapor Deposition) method (FIG. 2M). Then, a photoresist 36 is formed by photo lithography. The photoresist 36 is formed in the parts in which the gate electrodes are to be formed, i.e., in the parts of the polysilicon film 10 that are formed on the SOI layer 4 and the well layer 8. Next, the polysilicon film 10 located inside the openings of the photoresist 36 is removed by, for example, dry-etching. As a result, a gate electrode 10a of the logic MOSFET 101a is formed in the logic circuit region 101 and gate electrodes 10b of the switch MOSFETs 102a and 102b are formed in the switch circuit region 102 (FIG. 2N).

After the gate electrodes are formed, the photoresist 36 is removed. Then, LDD ion implantation is performed by using the gate electrodes 10a and 10b as masks in order to form an LDD (Lightly Doped Drain) structure. Next, an oxide film is formed by, for example, a plasma CVD method and the formed oxide film is etched back by, for example, dry-etching. As a result, sidewalls are formed on the sides of the gate electrodes 10a and 10b. After that, ion implantation is performed and sources and drains are formed (FIG. 2O). Note that in FIG. 2O, for simplifying the figure, the source regions and the drain regions, which are formed by the LDD ion implantation and the subsequent ion implantation, are shown as diffusion layers 12a and diffusion layers 12b in the logic circuit region 101 and the switch circuit region 102 respectively.

Next, silicides 13a to 13d are formed on the surface of the gate electrodes and the diffusion layers by, for example, a sputtering method. The silicide 13a is formed on the gate electrode 10a and the silicide 13b is formed on the diffusion layers 12a. The silicide 13c is formed on the gate electrodes 10b and the silicide 13d is formed on the diffusion layers 12b (FIG. 2P).

Finally, an inter-layer insulating film 14 is formed by a known inter-layer insulating film forming technique. As a result, the semiconductor device 100 shown in FIG. 1 can be formed.

In the above-described semiconductor device 100 and its manufacturing method, the LOCOS oxide film 6b for the switch MOSFETs 102a and 102b is formed by using trenches formed in the substrate Sub1 (epitaxial layer 2 and high-resistance substrate 1). Therefore, even when an LOCOS oxide film 6b having a thickness equal to or greater than 2.0 μm is formed, the LOCOS oxide film 6b never protrudes beyond the upper surface of the substrate Sub1 (upper surface of epitaxial layer 2). As a result, it is possible to prevent the occurrence of a difference in height due to the LOCOS oxide film formation. Note that other differences in height that are generated during the manufacturing process are similar to those generated in an ordinary semiconductor manufacturing process. Therefore, according to this structure and this manufacturing method, it is possible to prevent the occurrence of a high difference in height that would be otherwise generated when the LOCOS oxide film is formed and thereby to provide a semiconductor device having high accuracy in dimensions and an excellent yield.

Second Embodiment

Next, a semiconductor device 200 according to a second embodiment of the present invention is explained. FIG. 3 is a cross section schematically showing a structure of a semiconductor device 200 according to the second embodiment. The semiconductor device 200 includes an interface carrier suppression layer 15 below the LOCOS oxide film 6b. That is, a substrate Sub2 of the semiconductor device 200 has such a structure that an interface carrier suppression layer 15 is added in the substrate Sub1 of the semiconductor device 100. The interface carrier suppression layer 15 is formed as a layer having a smaller specific resistance than that of the high-resistance substrate 1. The other structure of the semiconductor device 200 is similar to that of the semiconductor device 100, and therefore its explanation is omitted.

Figure 4A:
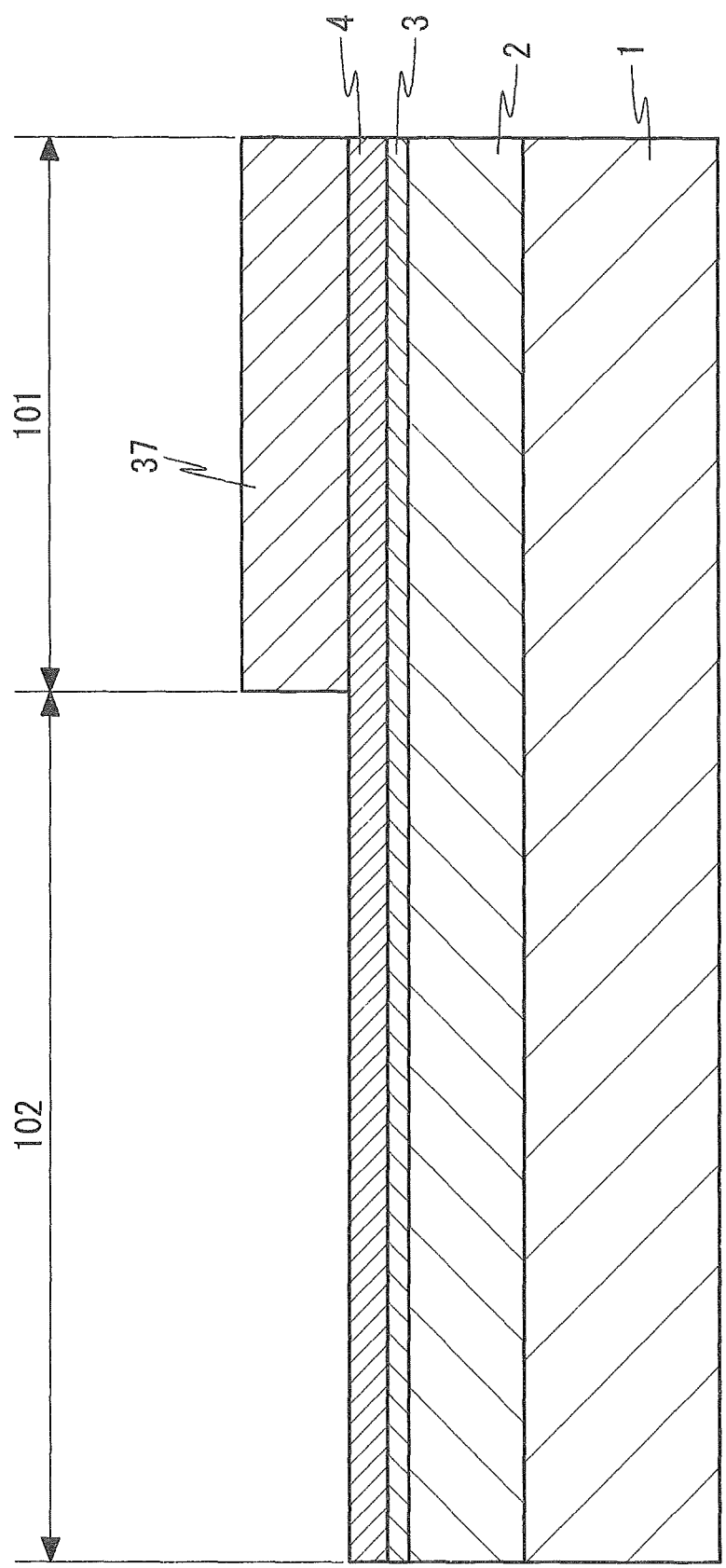
FIG. 4A is a cross section schematically showing a manufacturing method of a substrate Sub2 of a semiconductor device 200 according to a second embodiment.
Figure 4B:
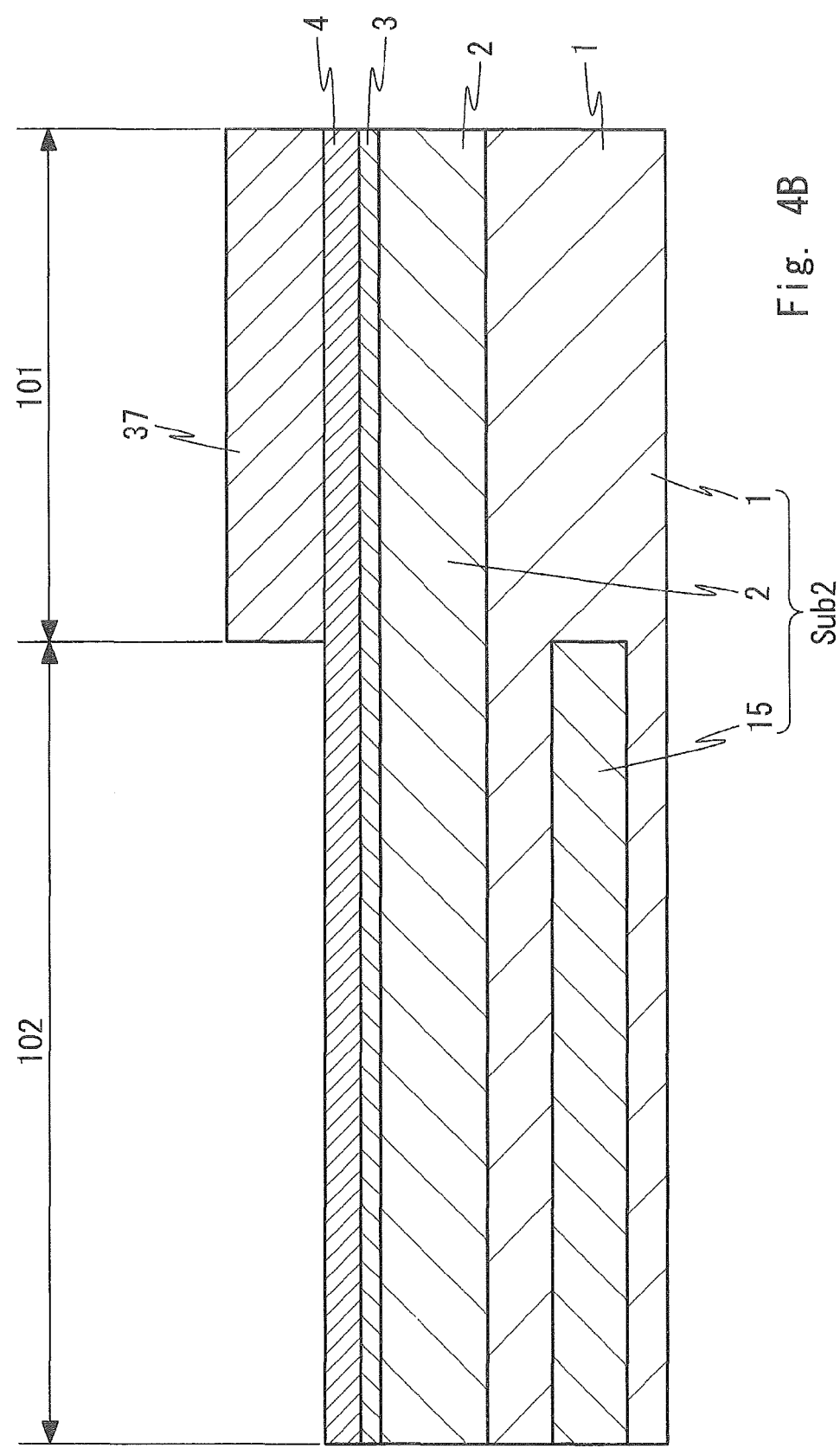
FIG. 4B is a cross section schematically showing a manufacturing method of a substrate Sub2 of a semiconductor device 200 according to a second embodiment.
Figure 5:
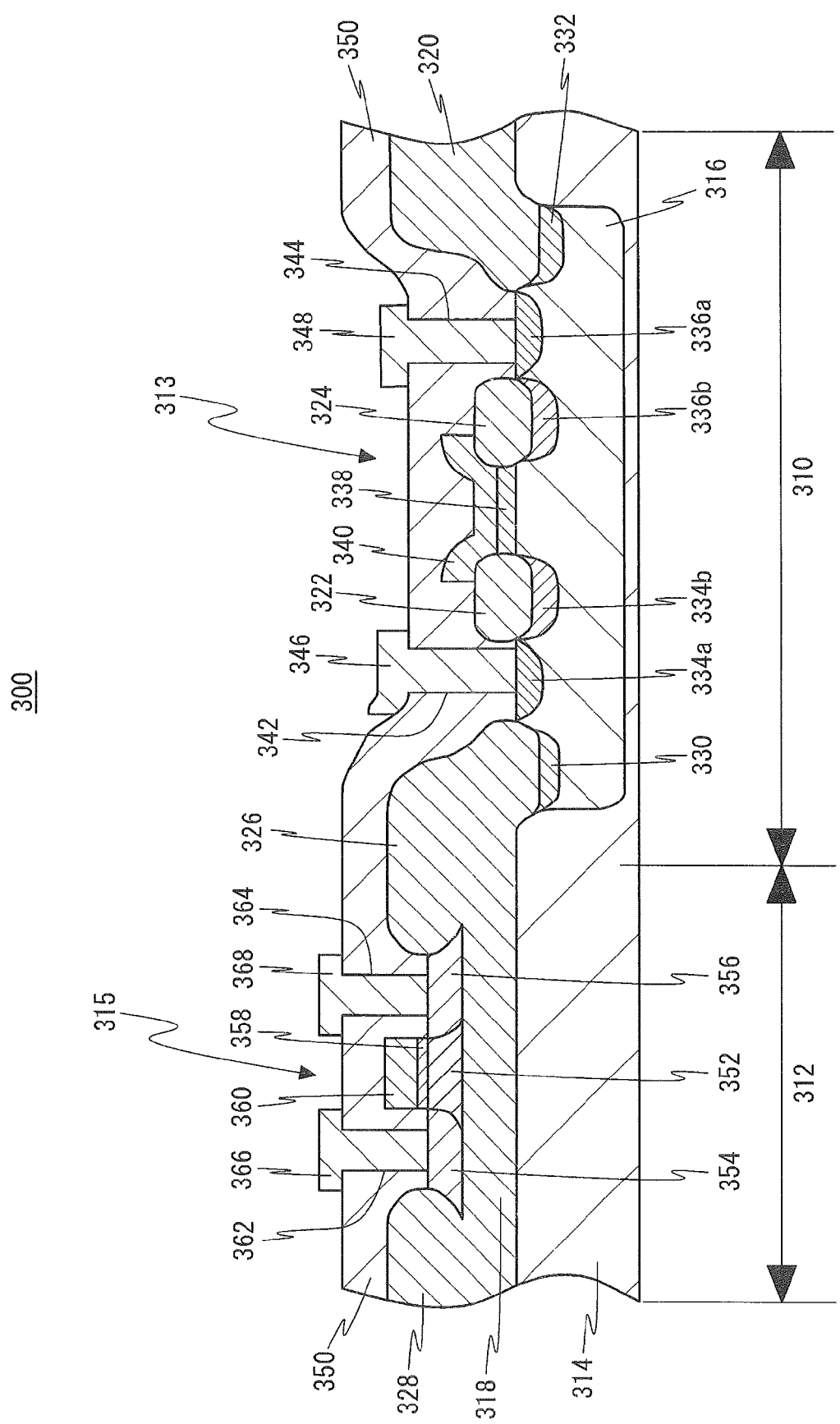
FIG. 5 is a cross section schematically showing a semiconductor device 300.

Next, a manufacturing method of the semiconductor device 200 is explained. The manufacturing method of the semiconductor device 200 is different in the manufacturing method of the substrate. FIGS. 4A and 4B are cross sections schematically showing a manufacturing method of the substrate Sub2 of the semiconductor device 200. The manufacturing method of the semiconductor device 200 is similar to that of the semiconductor device 100 except that the process shown in FIG. 2A is replaced by the processes shown in FIGS. 4A and 4B.

In this manufacturing method, by using photo lithography, a photoresist 37 is formed above the epitaxial layer 2 so as to cover only the logic circuit region 101 (FIG. 4A) Then, an interface carrier suppression layer 15 is formed in a region at a predetermined depth of the high-resistance substrate 1 by high-energy ion implantation (FIG. 4B). The subsequent manufacturing processes performed after the photoresist 37 is removed are similar to those shown in FIGS. 2B to 2P expect for the presence of the interface carrier suppression layer 15, and therefore their explanation is omitted.

In general, when a MOSFET having an SOI structure is applied to a high-speed device, a depletion layer is sometimes generated within the high-resistance substrate in a region below a thick oxide film such as the LOCOS oxide film 6b. As a result, a situation that a high-speed operation of the semiconductor device is hindered may occur. However, in the above-described semiconductor device 200 and its manufacturing method, the interface carrier suppression layer 15 is formed below the LOCOS oxide film 6b. This feature can prevent the occurrence of a depletion layer within the high-resistance substrate in the region below the LOCOS oxide film 6b. Therefore, according to this structure and this manufacturing method, it is possible not only to obtain similar advantageous effects to those of the semiconductor device 100 and its manufacturing method but also to provide a semiconductor device that can excellently perform a high-speed operation and its manufacturing method.

Note that the present invention is not limited to the above-described embodiments, and modifications can be made as appropriate without departing from the spirit of the present invention. For example, the trenches 5b may be formed in such a manner that they do not penetrate the epitaxial layer 2. Further, the trenches 5b may penetrate the interface carrier suppression layer 15 or may not penetrate the interface carrier suppression layer 15.

The above-mentioned materials for the oxide film, the nitride film, and so on are mere examples. For example, other insulating films such as a silicon oxide film, a silicon nitride film, and a silicon oxynitride film can be also applied. Further, the semiconductor (silicon) conductive types are also mere examples. For example, the p-type and the n-type may be interchanged.

This application is based upon and claims the benefit of priority from Japanese patent application No. 2011-72699, filed on Mar. 29, 2011, the disclosure of which is incorporated herein in its entirety by reference.

INDUSTRIAL APPLICABILITY

Reference Signs List

1 HIGH-RESISTANCE SUBSTRATE
2 EPITAXIAL LAYER

3 BURIED OXIDE FILM
4 SOI LAYER
5 TRENCH
6A, 6B LOCOS OXIDE FILM
7 OXIDE FILM
8 WELL LAYER
9A, 9B GATE OXIDE FILM
10 POLYSILICON FILM
10A, 10B GATE ELECTRODE
11 SIDEWALL
12A, 12B DIFFUSION LAYER
13A-13D SILICIDE
14 INTER-LAYER INSULATING FILM
15 INTERFACE CARRIER SUPPRESSION LAYER
21 OXIDE FILM
22 NITRIDE FILM
31-37 PHOTORESIST
100, 200, 300 SEMICONDUCTOR DEVICE
101 LOGIC CIRCUIT REGION
102 SWITCH CIRCUIT REGION
101A LOGIC MOSFET
102A, 102B SWITCH MOSFET
310 FIRST REGION
312 SECOND REGION
313 HIGH WITHSTAND-VOLTAGE TRANSISTOR
314 SILICON SUBSTRATE
315 MOS FIELD-EFFECT TRANSISTOR
316 WELL
318 BURIED OXIDE FILM
320, 326, 328 ELEMENT SEPARATION LOCOS OXIDE FILM
322, 324 OFFSET LOCOS OXIDE FILM
330, 332 CHANNEL STOPPER REGION
334A, 336A, 354, 356 SOURCE/DRAIN
334B, 336B SOURCE/DRAIN OFFSET
338, 358 GATE OXIDE FILM
340, 360 GATE ELECTRODE
342, 344, 362, 364 THROUGH HOLE
346, 348, 366, 368 ALUMINUM LINE
350 INTER-LAYER INSULATING FILM
352 BODY REGION
Sub1, Sub2 SUBSTRATE

The invention claimed is:

1. A semiconductor device comprising:
a first MOSFET formed on a high-resistance substrate; and
a second MOSFET that is monolithic-integrated with the first MOSFET on the high-resistance substrate,
wherein the first MOSFET comprises:
a first semiconductor layer formed on the high-resistance substrate; and
a second semiconductor layer formed above the first semiconductor layer, the second semiconductor layer serving as a well layer of the first MOSFET, and
the second MOSFET comprises:
a first insulating layer formed on the high-resistance substrate, first insulating layer being sandwiched between two trenches and thus having a mesa-shape in its upper part, an upper surface of the mesa-shape being positioned at the same height as the first semiconductor layer;
a second insulating layer formed on the mesa-shape of the first insulating layer; and
a third semiconductor layer formed on the second insulating layer, the third semiconductor layer serving as a well layer of the second MOSFET.

2. The semiconductor device according to claim 1, wherein the first MOSFET further comprises:
first and second element separations formed above the first semiconductor layer so as to sandwich the second semiconductor layer therebetween;
first and second diffusion layers formed above the second semiconductor layer, the first and second diffusion layers being apart from each other;
a first gate insulating film formed on the second semiconductor layer located between the first and second diffusion layers; and
a first gate electrode formed on the first gate insulating film, and
the second MOSFET further comprises:
third and fourth diffusion layers formed above the third semiconductor layer, the third and fourth diffusion layers being apart from each other;
a second gate insulating film formed on the third semiconductor layer located between the third and fourth diffusion layers; and
a second gate electrode formed on the second gate insulating film.

3. The semiconductor device according to claim 1, further comprising a fourth semiconductor layer formed between the high-resistance substrate and the first insulating layer, the fourth semiconductor layer having a smaller specific resistance than that of the high-resistance substrate.

4. A semiconductor device comprising:
a first MOSFET formed on a high-resistance substrate; and
a second MOSFET that is monolithic-integrated with the first MOSFET on the high-resistance substrate,
wherein the first MOSFET comprises:
a first semiconductor layer formed on the high-resistance substrate; and
a second semiconductor layer formed above the first semiconductor layer, the second semiconductor layer serving as a well layer of the first MOSFET, and
the second MOSFET comprises:
a first insulating layer formed on the high-resistance substrate, the first insulating layer having a mesa-shape in its upper part, the mesa-shape being formed by forming trenches in the first semiconductor layer and then performing oxidation treatment from a side and a bottom of the trenches and thereby being sandwiched between two trenches;
a second insulating layer formed on the mesa-shape of the first insulating layer; and
a third semiconductor layer formed on the second insulating layer, the third semiconductor layer serving as a well layer of the second MOSFET.

5. The semiconductor device according to claim 4, wherein the first MOSFET further comprises:
first and second element separations formed above the first semiconductor layer so as to sandwich the second semiconductor layer therebetween;
first and second diffusion layers formed above the second semiconductor layer, the first and second diffusion layers being apart from each other;
a first gate insulating film formed on the second semiconductor layer located between the first and second diffusion layers; and
a first gate electrode formed on the first gate insulating film, and
the second MOSFET further comprises:
third and fourth diffusion layers formed above the third semiconductor layer,
the third and fourth diffusion layers being apart from each other;

a second gate insulating film formed on the third semiconductor layer located between the third and fourth diffusion layers; and a second gate electrode formed on the second gate insulating film.

6. The semiconductor device according to claim 4, further comprising a fourth semiconductor layer formed between the high-resistance substrate and the first insulating layer, the fourth semiconductor layer having a smaller specific resistance than that of the high-resistance substrate.

7. The semiconductor device according to claim 4, wherein a trench is formed in the first semiconductor layer formed on the high-resistance substrate of the second MOSFET, the trench being formed so as not to penetrate the first semiconductor layer.

8. The semiconductor device according to claim 4, wherein a trench is formed in the first semiconductor layer formed on the high-resistance substrate of the second MOSFET, the trench being formed so as to reach the high-resistance substrate.

9. The semiconductor device according to claim 6, wherein a trench is formed in the first semiconductor layer formed on the high-resistance substrate of the second MOSFET, the trench being formed so as to penetrate that first semiconductor layer and reach the fourth semiconductor layer.

10. A manufacturing method of a semiconductor device comprising:

forming a first semiconductor layer on a high-resistance substrate;

forming a second insulating layer on the first semiconductor layer;

forming a third semiconductor layer on the second insulating layer, the third semiconductor layer serving as a well layer of a second MOSFET;

removing the second insulating layer and the third semiconductor layer in a first region and forming an opening in the second insulating layer and the third semiconductor layer in a second region;

forming trenches by etching the first semiconductor layer in the opening formed in the second insulating layer and the third semiconductor layer in the second region, and thereby forming a mesa-shape sandwiched between two trenches in the first semiconductor layer located below the second insulating layer and the third semiconductor layer;

forming a first insulating layer by performing oxidation treatment from a side and a bottom of the trenches, the first insulating layer being sandwiched between two trenches and thus having a mesa-shape in its upper part; and forming a second semiconductor layer above the first semiconductor layer in the first region, the second semiconductor layer serving as a well layer of a first MOSFET.

11. The manufacturing method of a semiconductor device according to claim 10, further comprising:

forming, prior to the formation of the second semiconductor layer, first and second element separations above the first semiconductor layer in the first region, first and second element separations being apart from each other;

forming the second semiconductor layer by performing ion implantation into the first semiconductor layer located between the first and second element separations;

forming a first gate insulating film on the second semiconductor layer and forming a second gate insulating film on the third semiconductor layer;

forming a first gate electrode on the first gate insulting film and forming a second gate electrode on the second gate insulting film;

etching the first gate insulating film by using the first gate electrode as a mask and etching the second gate insulating film by using the second gate electrode as a mask; and forming first and second diffusion layers by performing ion implantation into the second semiconductor layer by using the first gate electrode as a mask and forming third and fourth diffusion layers by performing ion implantation into the third semiconductor layer by using the second gate electrode as a mask.

12. The manufacturing method of a semiconductor device according to claim 10, further comprising forming, after the first semiconductor layer is formed, a fourth semiconductor layer between the high-resistance substrate and the first insulating layer by ion implantation, the fourth semiconductor layer having a smaller specific resistance than that of the high-resistance substrate.

13. The manufacturing method of a semiconductor device according to claim 10, wherein a trench to be formed in the first semiconductor layer in the second region is formed so as not to penetrate the first semiconductor layer.

14. The manufacturing method of a semiconductor device according to claim 10, wherein a trench to be formed in the first semiconductor layer in the first region is formed so as to reach the high-resistance substrate.

15. The manufacturing method of a semiconductor device according to claim 12, wherein a trench to be formed in the first semiconductor layer in the first region is formed so as to penetrate that first semiconductor layer and reach the fourth semiconductor layer.

16. The semiconductor device according to claim 1, wherein the high-resistance substrate comprises silicon having a specific resistance p of approximately 10 kΩ.cm.

17. The semiconductor device according to claim 1, wherein the first MOSFET comprises a logic MOSFET and the second MOSFET comprises a switch MOSFET.

18. The semiconductor device according to claim 1, wherein first insulating layer including the mesa-shape comprises a LOCOS (LOCal Oxidation of Silicon) structure formed using a thermal oxidation process and the second insulating layer comprises a silicon oxide film formed using a plasma CVD (Chemical Vapor Deposition) process.

19. The semiconductor device according to claim 18, the mesa-shaped LOCOS structure thereby provides an oxide layer providing sufficient thickness to reduce a parasitic capacitance to the high resistance substrate for the second MOSFET in a manner that keeps heights of the first and second MOSFETs to be approximately equal.

20. The semiconductor device according to claim 18, further comprising a carrier suppression layer formed in the high resistance substrate under the mesa-shaped LOCOS structure using a high-energy ion implantation processing.

* * * * *